US012672567B2

(12) United States Patent (10) Patent No.: US 12,672,567 B2
Choi (45) Date of Patent: Jun. 30, 2026

(54) PRINTED CIRCUIT BOARD, SEMICONDUCTOR PACKAGE, AND METHOD OF FABRICATING THE SAME

(71) Applicant: Samsung Electronics Co., Ltd., Suwon-si (KR)

(72) Inventor: Beoungjun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 557 days.

(21) Appl. No.: 18/302,884

(22) Filed: Apr. 19, 2023

(65) Prior Publication Data

US 2024/0047337 A1 Feb. 8, 2024

(30) Foreign Application Priority Data

Aug. 4, 2022 (KR) ......................... 10-2022-0097544

(51) Int. Cl.
*H01L 23/498* (2006.01)
*H10W 70/05* (2026.01)
(Continued)

(52) U.S. Cl.
CPC ......... *H10W 70/65* (2026.01); *H10W 70/095* (2026.01); *H10W 70/635* (2026.01); *H10W 70/68* (2026.01); *H10W 74/117* (2026.01); *H10W 99/00* (2026.01); *H10W 72/252* (2026.01); *H10W 72/5445* (2026.01); *H10W 72/884* (2026.01); *H10W 90/724* (2026.01);
(Continued)

(58) Field of Classification Search
CPC ......... H01L 23/49838; H01L 23/49827; H01L 21/486; H10W 70/65; H10W 70/095; H10W 70/635
See application file for complete search history.

(56) References Cited

U.S. PATENT DOCUMENTS 6,964,884 B1 * 11/2005 Chan ...................... H05K 3/383
438/118
8,445,979 B2 5/2013 Oh et al.
(Continued)

FOREIGN PATENT DOCUMENTS

KR 19990073289 A 10/1999
KR 101067223 B1 9/2011
(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A printed circuit board includes a substrate body, first, second, and third upper conductive patterns side by side in a first direction on a top surface of the substrate body, and a photosensitive dielectric layer that at least partially covers the top surface of the substrate body. A first trench is in the substrate body between the first and second upper conductive patterns. The first trench has a first surface roughness at a bottom surface thereof. The substrate body has a second surface roughness at the top surface thereof between the second and third upper conductive patterns. The first surface roughness is greater than the second surface roughness. Each of the first and second upper conductive patterns has a first thickness. The third upper conductive pattern has a second thickness greater than the first thickness.

19 Claims, 19 Drawing Sheets

(51) Int. Cl.

| | |
|---|---|
| *H10W 70/63* | (2026.01) |
| *H10W 70/65* | (2026.01) |
| *H10W 70/68* | (2026.01) |
| *H10W 74/10* | (2026.01) |
| *H10W 99/00* | (2026.01) |
| *H10W 72/00* | (2026.01) |
| *H10W 72/20* | (2026.01) |
| *H10W 72/50* | (2026.01) |
| *H10W 90/00* | (2026.01) |

(52) U.S. Cl.
    CPC ........ *H10W 90/734* (2026.01); *H10W 90/754*
                                          (2026.01)

(56) References Cited

U.S. PATENT DOCUMENTS

| | | | |
|---|---|---|---|
| 8,988,892 B2 | 3/2015 | Kim | |
| 9,466,789 B2 | 10/2016 | Wang et al. | |
| 2007/0126112 A1 | 6/2007 | Cho et al. | |
| 2012/0074538 A1* | 3/2012 | Tsai ................... | H10W 74/114 |
| | | | 257/659 |
| 2012/0153445 A1* | 6/2012 | Son ................... | H01L 23/49833 |
| | | | 257/668 |

FOREIGN PATENT DOCUMENTS

| | | |
|---|---|---|
| KR | 101538544 B1 | 7/2015 |
| KR | 20210090940 A | 7/2021 |

* cited by examiner

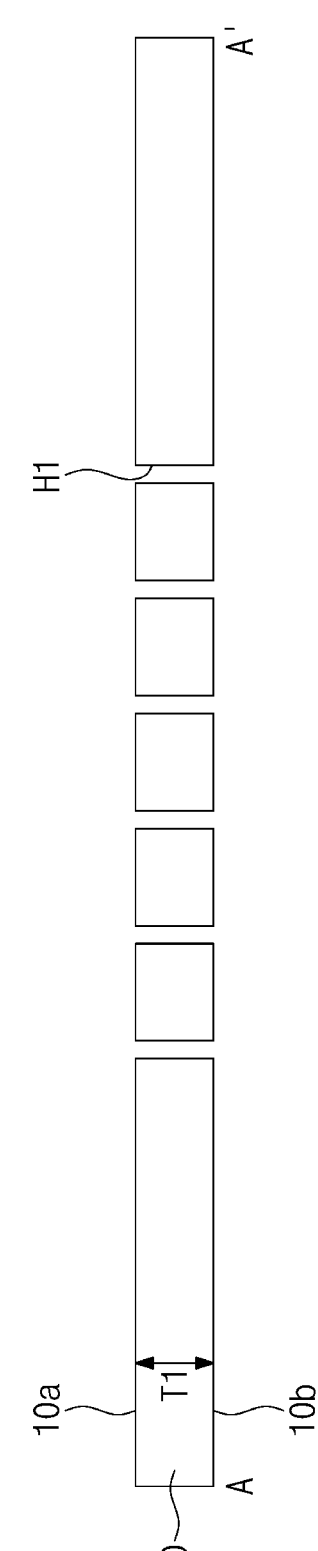

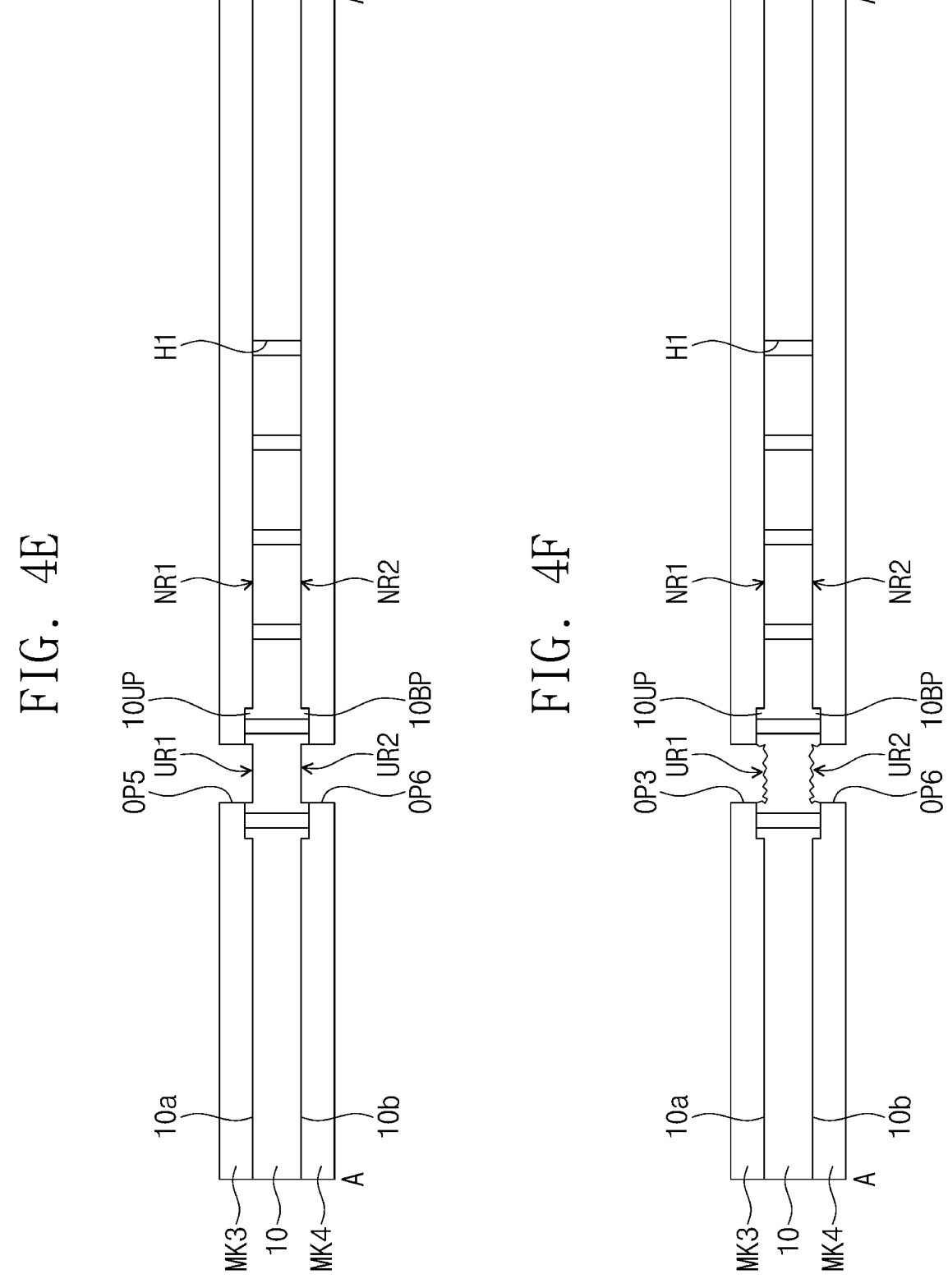

PRINTED CIRCUIT BOARD, SEMICONDUCTOR PACKAGE, AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0097544, filed on Aug. 4, 2022 in the Korean Intellectual Property Office, the disclosure of which is hereby incorporated by reference in its entirety.

BACKGROUND

The present inventive concepts relate to a printed circuit board, a semiconductor package, and a method of fabricating the same.

A printed circuit board can be used as a package substrate of a semiconductor package or a board substrate on which semiconductor packages are mounted. With the development of electronic industry, electronic products have increasing demands for high performance, high speed, and compact size. In response to this trend, conductive patterns of a printed circuit board are becoming finer and finer. In addition, many studies are also being conducted on semiconductor devices and semiconductor packages.

SUMMARY

Some embodiments of the present inventive concepts provide a highly integrated printed circuit board with improved reliability.

Some embodiments of the present inventive concepts provide a semiconductor package with improved reliability.

Some embodiments of the present inventive concepts provide a method of fabricating a printed circuit board, which method has an increased yield.

According to some embodiments of the present inventive concepts, a printed circuit board may include: a substrate body; first, second, and third upper conductive patterns that are side by side in a first direction on a top surface of the substrate body; and a photosensitive dielectric layer that at least partially covers the top surface of the substrate body. A first trench may be in the substrate body between the first and second upper conductive patterns. The first trench may have a first surface roughness at a bottom surface thereof. The substrate body may have a second surface roughness at the top surface thereof between the second and third upper conductive patterns. The first surface roughness may be greater than the second surface roughness. Each of the first and second upper conductive patterns may have a first thickness. The third upper conductive pattern may have a second thickness greater than the first thickness.

According to some embodiments of the present inventive concepts, a printed circuit board may include: a substrate body; first, second, and third upper conductive patterns that are side by side in a first direction on a top surface of the substrate body and are spaced apart from each other; and a photosensitive dielectric layer that at least partially covers the top surface of the substrate body. A first trench may be in the substrate body between the first and second upper conductive patterns. The first trench may have a first surface roughness at a bottom surface of the first trench. The substrate body may have a second surface roughness at the top surface of the substrate body between the second and third upper conductive patterns. The first surface roughness may be greater than the second surface roughness. The substrate body may have a first maximum thickness. The substrate body may include a substrate protrusion by the first trench. The first and second upper conductive patterns may be on the substrate protrusion. The substrate protrusion may have a second thickness from the bottom surface of the first trench. Each of the first and second upper conductive patterns may have a third thickness and a first width. The third upper conductive pattern may have a fourth thickness greater than the third thickness. The third upper conductive pattern may have a second width less than the first width. The second thickness may be about $\frac{1}{20}$ to about $\frac{1}{5}$ the first maximum thickness.

According to some embodiments of the present inventive concepts, a semiconductor package may include: a substrate; at least one semiconductor chip mounted on and connected to the substrate; and a mold layer that covers the semiconductor chip and a portion of the substrate. The substrate may include: a first dielectric layer; first, second, and third upper conductive patterns that are side by side in a first direction on a top surface of the first dielectric layer; and a second dielectric layer that at least partially covers the top surface of the first dielectric layer. A first trench may be in the first dielectric layer between the first and second upper conductive patterns. The first trench may have an irregular uneven bottom surface. Each of the first and second upper conductive patterns may have a first width. The third upper conductive pattern may have a second width less than the first width.

According to some embodiments of the present inventive concepts, a method of fabricating a printed circuit board may include: providing a substrate body; forming a through hole in the substrate body; forming first and second mask patterns on a top surface of the substrate body that are spaced apart from each other; using the first and second mask patterns as an etching mask to etch the top surface of the substrate body to form a first trench between the first and second mask patterns and to form substrate upper protrusions below the first and second mask patterns; forming an irregular uneven structure on a bottom surface of the first trench; and forming first and second conductive patterns on the substrate upper protrusions and a third conductive pattern on the top surface of the substrate body, the third conductive pattern being spaced apart from the first and second conductive patterns.

BRIEF DESCRIPTION OF THE DRAWINGS

FIGS. 4A to 4I illustrate cross-sectional views showing a method of fabricating a printed circuit board having a cross-section of FIG. 2A.

FIG. 8 illustrates an enlarged view showing section P1 of FIG. 7.

FIG. 11 illustrates a cross-sectional view showing a semiconductor package according to some embodiments of the present inventive concepts.

DETAILED DESCRIPTION

Some embodiments of the present inventive concepts will now be described in detail with reference to the accompanying drawings to aid in clearly explaining the present inventive concepts. In this description, such terms as "first" and "second" may be used to simply distinguish identical or similar components from each other, and the sequence of such terms may be changed in accordance with the order of mention.

Figure 1:
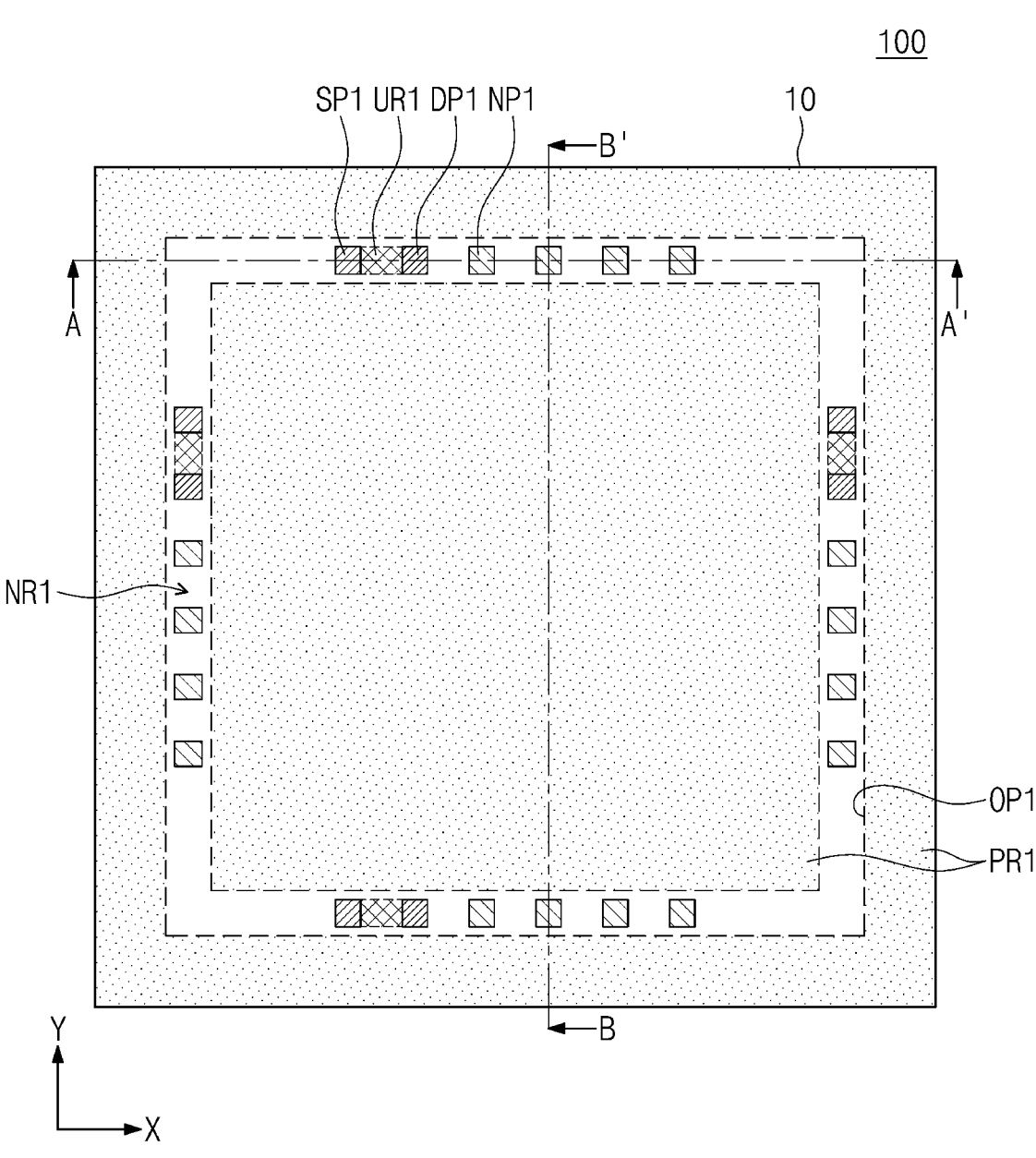
FIG. 1 illustrates a plan view showing a printed circuit board according to some embodiments of the present inventive concepts.
Figure 2A:
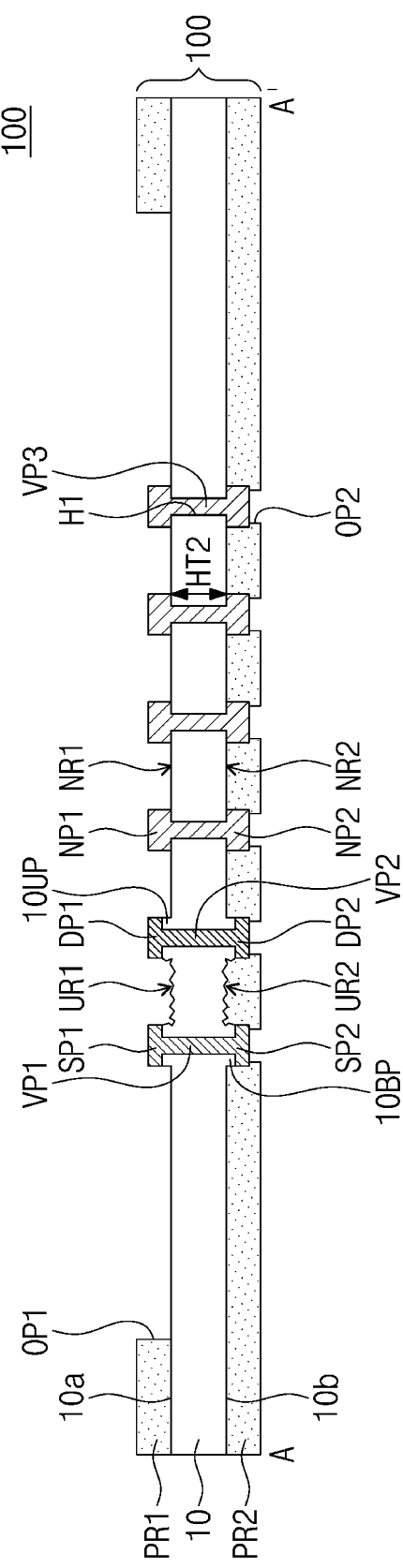
FIG. 2A illustrates a cross-sectional view taken along line A-A' of FIG. 1.
Figure 2B:
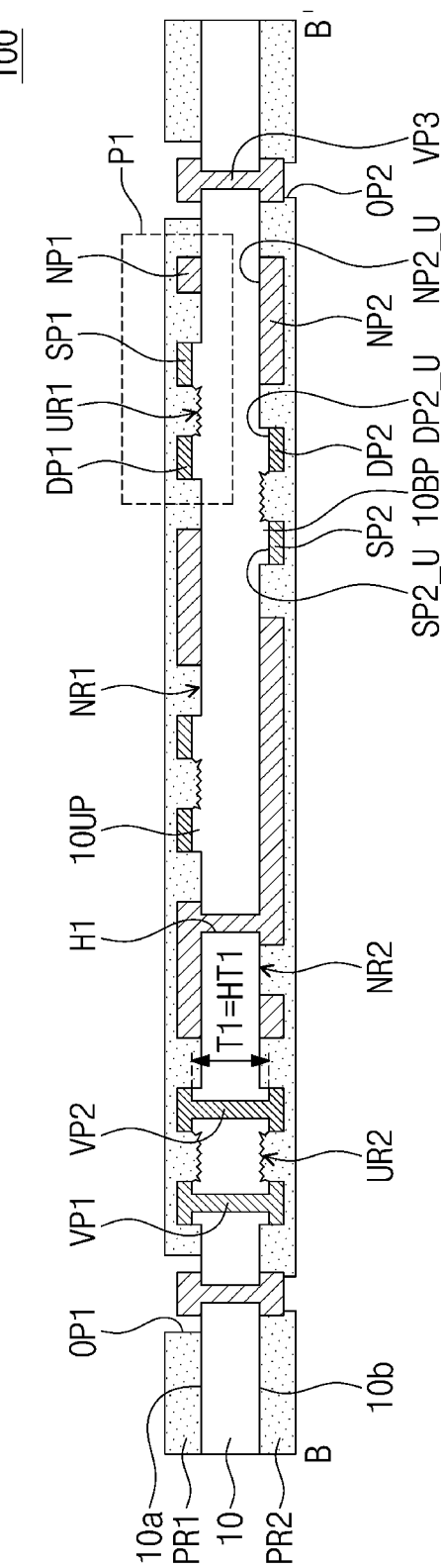
FIG. 2B illustrates a cross-sectional view taken along line B-B' of FIG. 1.
Figure 3A:
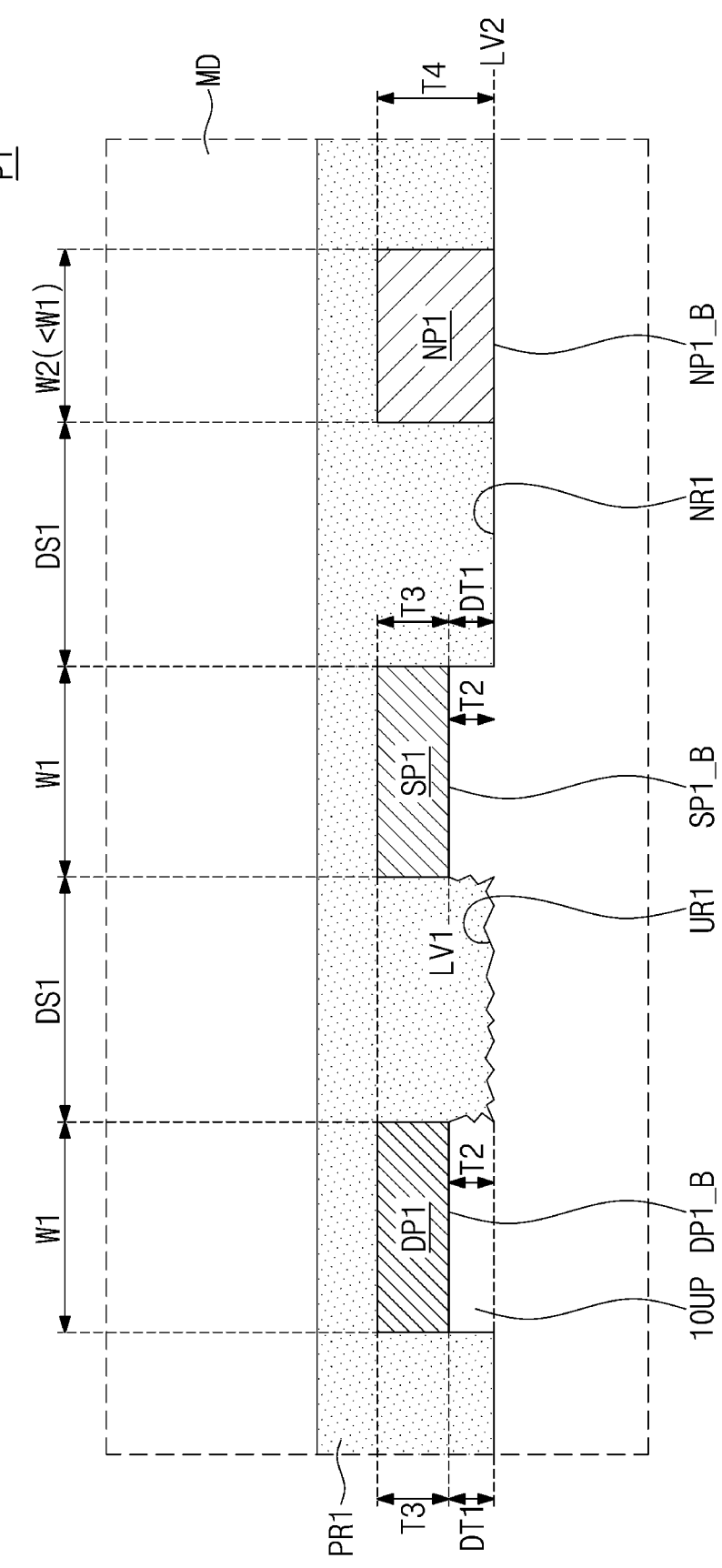
FIG. 3A illustrates an enlarged view showing section P1 of FIG. 2B.
Figure 3B:
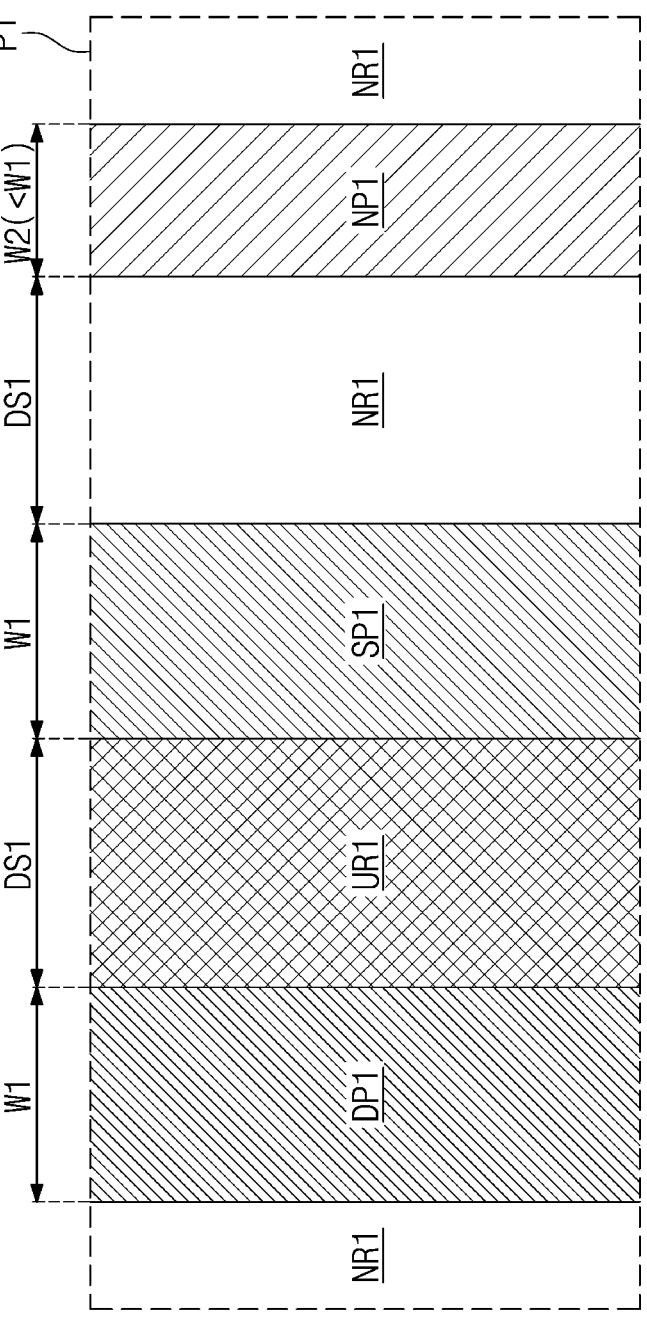
FIG. 3B illustrates a plan view partially showing section P1 of FIG. 2B.

FIG. 1 illustrates a plan view showing a printed circuit board according to some embodiments of the present inventive concepts. FIG. 2A illustrates a cross-sectional view taken along line A-A' of FIG. 1. FIG. 2B illustrates a cross-sectional view taken along line B-B' of FIG. 1. FIG. 3A illustrates an enlarged view showing section P1 of FIG. 2B. FIG. 3B illustrates a plan view partially showing section P1 of FIG. 2B.

Referring to FIGS. 1, 2A, and 2B, a printed circuit board 100 according to some embodiments of the present inventive concepts may be a double-sided printed circuit board. The printed circuit board 100 may include a substrate body 10, an upper photosensitive dielectric layer PR1 that at least partially covers a top surface 10a of the substrate body 10, and a lower photosensitive dielectric layer PR2 that at least partially covers a bottom surface 10b of the substrate body 10. In this description, the substrate body 10 may be called a dielectric layer or a core layer. Each of the upper and lower photosensitive dielectric layers PR1 and PR2 may be called a dielectric layer or a protection layer. In this description, the printed circuit board 100 may be called a substrate or package substrate.

The substrate body 10 may be formed of a thermosetting resin such as epoxy resin, a thermoplastic resin such as polyimide, a resin in which a thermosetting or thermoplastic resin is impregnated with a reinforcement such as glass fiber and/or inorganic filler, which impregnated resin includes a prepreg and/or photosensitive resin, but the present inventive concepts are not limited thereto. A photo-solder resist (PSR) may be used to form the upper photosensitive dielectric layer PR1 and the lower photosensitive dielectric layer PR2.

The substrate body 10 may have at least one through hole H1 that is formed to penetrate therethrough.

The substrate body 10 may be provided on its top surface 10a with first upper conductive patterns SP1, second upper conductive patterns DP1, and third upper conductive patterns NP1. The first, second, and third upper conductive patterns SP1, DP1, NP1 may be formed of the same material. For example, the first, second, and third upper conductive patterns SP1, DP1, NP1 may each have a single-layered or multi-layered structure of at least one selected from copper, nickel, and gold.

The upper photosensitive dielectric layer PR1 may have an upper opening OP1 such that the upper photosensitive dielectric layer PR1 covers some of the first, second, and third upper conductive patterns SP1, DP1, and NP1 and exposes others of the first, second, and third upper conductive patterns SP1, DP1, and NP1. For example, as shown in FIG. 1, the upper opening OP1 may have a shape that surrounds a central portion of the printed circuit board 100. The first, second, and third upper conductive patterns SP1, DP1, NP1 may each have a pad shape and/or a linear shape when viewed in plan.

Referring to FIGS. 1 to 3B, one of the first upper conductive patterns SP1 may be adjacent to one of the second upper conductive patterns DP1. One of the third upper conductive patterns NP1 may be adjacent to one of the first and second upper conductive patterns SP1 and DP1. One first upper conductive pattern SP1, one second upper conductive pattern DP1, and one third upper conductive pattern NP1 may be arranged side by side or in sequence in a first direction X or a second direction Y, and may be spaced apart from each other at a first interval or spacing DS1. The first interval DS1 may range, for example, from about 10 μm to about 100 μm.

The first upper conductive pattern SP1 and the second upper conductive pattern DP1 may have their positions that are changeable with each other. For example, one second upper conductive pattern DP1, one first upper conductive pattern SP1, and one third upper conductive pattern NP1 may be arranged side by side or in sequence in the first direction X or the second direction Y, and may be spaced apart from each other at the first interval DS1.

Referring back to FIGS. 1 to 3B, a difference in voltage between neighboring first and second upper conductive patterns SP1 and DP1 may be greater than that between neighboring first and third upper conductive patterns SP1 and NP1 or that between neighboring second and third upper conductive patterns DP1 and NP1. The first upper conductive patterns SP1 may be provided with, for example, a ground voltage Vss. The second upper conductive patterns DP1 may be provided with, for example, a power voltage Vdd. The third upper conductive patterns NP1 may be provided with a command/access/data signal voltage.

Referring to FIGS. 2A to 3B, the substrate body 10 may be provided on its top surface 10a with a first trench UR1 formed between the first and second upper conductive patterns SP1 and DP1. The first trench UR1 may be caused to provide the substrate body 10 with substrate upper protrusions 10UP. The substrate body 10 may have a first maximum thickness T1. The substrate upper protrusions 10UP may each have a second thickness T2 measured from a bottom surface of the first trench UR1. For example, the second thickness T2 may be about 1/20 to about 1/5 of the first maximum thickness T1.

The substrate body 10 may be provided on its top surface 10a with a first recess or recess region NR1 beside the substrate upper protrusion 10UP. In the present embodiment, the substrate upper protrusion 10UP may be positioned between the first trench UR1 and the first recess region NR1. The first and second upper conductive patterns SP1 and DP1 may be disposed on their respective substrate upper protrusions 10UP (e.g., first and second substrate upper protrusions 10UP). The third upper conductive patterns NP1 may be disposed on a bottom surface of the first recess region NR1.

The first trench UR1 may have an uneven shape or structure on the bottom surface thereof. The first trench UR1 may have a first surface roughness at the bottom surface thereof. The first recess region NR1 may have a second surface roughness at the bottom surface thereof. The first surface roughness may be greater than the second surface roughness. The first trench UR1 may also have the first surface roughness at a lateral surface thereof. Such structure having the first trench UR1 and a high surface roughness therein may allow neighboring first and second upper conductive patterns SP1 and DP1 having a large difference in voltage to have an effective interval substantially greater than the first interval DS1, which effective interval may correspond to a length of the top surface 10$a$ of the substrate body 10 between a lower corner of the first upper conductive pattern SP1 and a lower corner of the second upper conductive pattern DP1.

A bottom surface SP1_B of the first upper conductive pattern SP1 and a bottom surface DP1_B of the second upper conductive pattern DP1 may be located at a first vertical level LV1, and a bottom surface NP1_B of the third upper conductive pattern NP1 may be located at a second vertical level LV2 lower than the first level LV1. The bottom surface of the first trench UR1 may be located at a level the same as or lower than the second level LV2.

The first and second upper conductive patterns SP1 and DP1 may have their sidewalls aligned or misaligned with inner sidewalls of the first trench UR1.

Each of the first and second upper conductive patterns SP1 and DP1 may have a first width W1. Each of the third upper conductive patterns NP1 may have a second width W2 less than the first width W1. Each of the first and second upper conductive patterns SP1 and DP1 may have a third thickness T3. Each of the third upper conductive patterns NP1 may have a fourth thickness T4 greater than the third thickness T3.

The first and second upper conductive patterns SP1 and DP1 may include copper (Cu), and in a test under an extremely hot and humid environment, such as a biased highly accelerated stress test (bHAST), the copper may migrate between the first and second upper conductive patterns SP1 and DP1 having a large difference in voltage. Therefore, a bridge may be created due to the copper migration between the first and second upper conductive patterns SP1 and DP1, and the bridge may induce the occurrence of electric short-circuit between the first and second upper conductive patterns SP1 and DP1. Such problem may become more severe due to a reduction in interval between conductive patterns resulting from a decrease in form factor of a printed circuit board.

In contrast, according to the present inventive concepts, the first and second upper conductive patterns SP1 and DP1 may have therebetween a wide effective interval because of structural characteristics such as the presence of the first trench UR1 and a high surface roughness, and accordingly an electric short-circuit may be prevented between the first and second upper conductive patterns SP1 and DP1 in a biased highly accelerated stress test (bHAST). As a result, the printed circuit board 100 according to the present inventive concepts may increase in reliability.

Moreover, in the present inventive concepts, as there is a long effective interval, a printed circuit board may not need to change design of an interval between Vdd and Vss lines or positions of Vdd and Vss lines, and thus it may be advantageous in terms of manufacturing convenience and manufacturing management.

The substrate body 10 may be provided on its bottom surface 10$b$ with first lower conductive patterns SP2, second lower conductive patterns DP2, and third lower conductive patterns NP2. The first, second, and third lower conductive patterns SP2, DP2, and NP2 may have their shapes, arrangements, and intervals, and a structure of the substrate body 10 therebetween may be identical or similar to those of the first, second, and third upper conductive patterns SP1, DP1, and NP1.

The first, second, and third lower conductive patterns SP2, DP2, and NP2 may include, for example, the same material. For example, the first, second, and third lower conductive patterns SP2, DP2, and NP2 may have a single-layered or multi-layered structure formed of at least one selected from copper, nickel, and gold.

The lower photosensitive dielectric layer PR2 may have a lower opening OP2 such that the lower photosensitive dielectric layer PR2 covers some of the first, second, and third lower conductive patterns SP2, DP2, and NP2 and exposes others of the first, second, and third lower conductive patterns SP2, DP2, and NP2. For example, like the upper opening OP1 of FIG. 1, the lower opening OP2 may have a shape that surrounds the central portion of the printed circuit board 100 when viewed in plan. Each of the first, second, and third lower conductive patterns SP2, DP2, and NP2 may have a pad shape and/or a linear shape when viewed in plan.

Referring to FIGS. 2A and 2B, one of the first lower conductive patterns SP2 may be adjacent to one of the second lower conductive patterns DP2. One of the third lower conductive patterns NP2 may be adjacent to one of the first and second lower conductive patterns SP2 and DP2. One first lower conductive pattern SP2, one second lower conductive pattern DP2, and one third lower conductive pattern NP2 may be arranged side by side or in sequence in the first direction X or the second direction Y, and may be spaced apart from each other at the first interval DS1. The first lower conductive pattern SP2 and the second lower conductive pattern DP2 may have their positions that are changeable with each other. For example, one second lower conductive pattern DP2, one first lower conductive pattern SP2, and one third lower conductive pattern NP2 may be arranged side by side in the first direction X or the second direction Y, and may be spaced apart from each other at the first interval DS1 of FIG. 3A.

Referring back to FIGS. 2A and 2B, a difference in voltage between neighboring first and second lower conductive patterns SP2 and DP2 may be greater than that between neighboring first and third lower conductive patterns SP2 and NP2 or that between neighboring second and third lower conductive patterns DP2 and NP2. The first conductive patterns SP2 may be provided with, for example, a power voltage Vdd. The second lower conductive patterns DP2 may be provided with, for example, a ground voltage Vss. The third lower conductive patterns NP2 may be provided with a command/access/data signal voltage.

Referring still to FIGS. 2A and 2B, the substrate body 10 may be provided on its bottom surface 10$b$ with a second trench UR2 formed between the first and second lower conductive patterns SP2 and DP2. The second trench UR2 may be an area that is upwardly recessed from the bottom surface 10$b$ of the substrate body 10. The second trench UR2 may be caused to provide the substrate body 10 with substrate lower protrusions 10BP. The substrate lower protrusions 10BP may have the second thickness T2 of FIG. 3A measured from a top surface of the second trench UR2. For example, the second thickness T2 may be about $\frac{1}{20}$ to about $\frac{1}{5}$ of the first maximum thickness T1 of the substrate body 10.

A second recess or recess region NR2 may be formed beside the substrate lower protrusions 10BP. The second recess region NR2 may be an area that is upwardly recessed from the bottom surface 10b of the substrate body 10. In the present embodiment, the substrate lower protrusion 10BP may be positioned between the second trench UR2 and the second recess region NR2. The first and second lower conductive patterns SP2 and DP2 may be disposed below respective substrate lower protrusions 10BP (e.g., first and second substrate lower protrusions 10BP). The third lower conductive patterns NP2 may be disposed on a top surface of the second recess region NR2.

The second trench UR2 may have an uneven shape or structure on the top surface thereof. The second trench UR2 may have a third surface roughness at the top surface thereof. The second recess region NR2 may have a fourth surface roughness at the top surface thereof. The third surface roughness may be greater than the fourth surface roughness. For example, the third surface roughness may be about 2 times to about 3 times the fourth surface roughness.

The second trench UR2 may also have the third surface roughness at a lateral surface thereof. Such structure having the second trench UR2 and a high surface roughness therein may allow neighboring first and second lower conductive patterns SP2 and DP2 having a large difference in voltage to have an effective interval substantially greater than the first interval DS1, which effective interval may correspond to a length of the top surface 10a of the substrate body 10 between an upper corner of the first lower conductive pattern SP2 and an upper corner of the second lower conductive pattern DP2.

A top surface SP2_U of the first lower conductive pattern SP2 and a top surface DP2_U of the second lower conductive pattern DP2 may be located at a lower vertical level than that of a top surface NP2_U of the third lower conductive pattern NP2.

The first and second lower conductive patterns SP2 and DP2 may have their sidewalls aligned or misaligned with inner sidewalls of the second trench UR2.

Each of the first and second lower conductive patterns SP2 and DP2 may have the first width W1 of FIG. 3A. Each of the third lower conductive patterns NP2 may have the second width W2 less than the first width W1. Each of the first and second lower conductive patterns SP2 and DP2 may have the third thickness T3. Each of the third lower conductive patterns NP2 may have a fourth thickness T4 greater than the third thickness T3. The fourth thickness T4 may be a sum of the third thickness T3 and the second thickness T2.

The first and second lower conductive patterns SP2 and DP2 may include copper (Cu), and in a biased highly accelerated stress test (bHAST), the copper may migrate between the first and second lower conductive patterns SP2 and DP2 having a large difference in voltage. Therefore, a bridge may be created due to the copper migration between the first and second lower conductive patterns SP2 and DP2, and the bridge may induce the occurrence of electric short-circuit between the first and second lower conductive patterns SP2 and DP2.

In contrast, according to the present inventive concepts, the first and second lower conductive patterns SP2 and DP2 may have therebetween a wide effective interval because of structural characteristics such as the presence of the second trench UR2 and a high surface roughness, and accordingly an electric short-circuit may be prevented between the first and second lower conductive patterns SP2 and DP2 in a biased highly accelerated stress test (bHAST).

One of the first upper conductive patterns SP1 and one of the first lower conductive patterns SP2 may be connected through a first via VP1 into a single unitary piece. One of the second upper conductive patterns DP1 and one of the second lower conductive patterns DP2 may be connected through a second via VP2 into a single unitary piece. One of the third upper conductive patterns NP1 and one of the third lower conductive patterns NP2 may be connected through a third via VP3 into a single unitary piece. Each of the first and second vias VP1 and VP2 may have a first vertical length HT1. The first vertical length HT1 may be the same as the first maximum thickness T1 of the substrate body 10. The third via VP3 may have a second vertical length HT2 less than the first vertical length HT1.

FIGS. 4A to 4I illustrate cross-sectional views showing a method of fabricating a printed circuit board having a cross-section of FIG. 2A.

Referring to FIG. 4A, a substrate body 10 may be prepared. The substrate body 10 may have a top surface 10a and a bottom surface 10b that are opposite to each other. The substrate body 10 may have a first maximum thickness T1. The substrate body 10 may be formed of a thermosetting resin such as epoxy resin, a thermoplastic resin such as polyimide, a resin in which a thermosetting or thermoplastic resin is impregnated with a reinforcement such as glass fiber and/or inorganic filler, which impregnated resin includes prepreg and/or photosensitive resin, but the present inventive concepts are not limited thereto.

Referring to FIG. 4B, at least one through hole H1 may be formed in the substrate body 10. The through hole H1 may be formed by laser drilling.

Figures 4C, 4D:
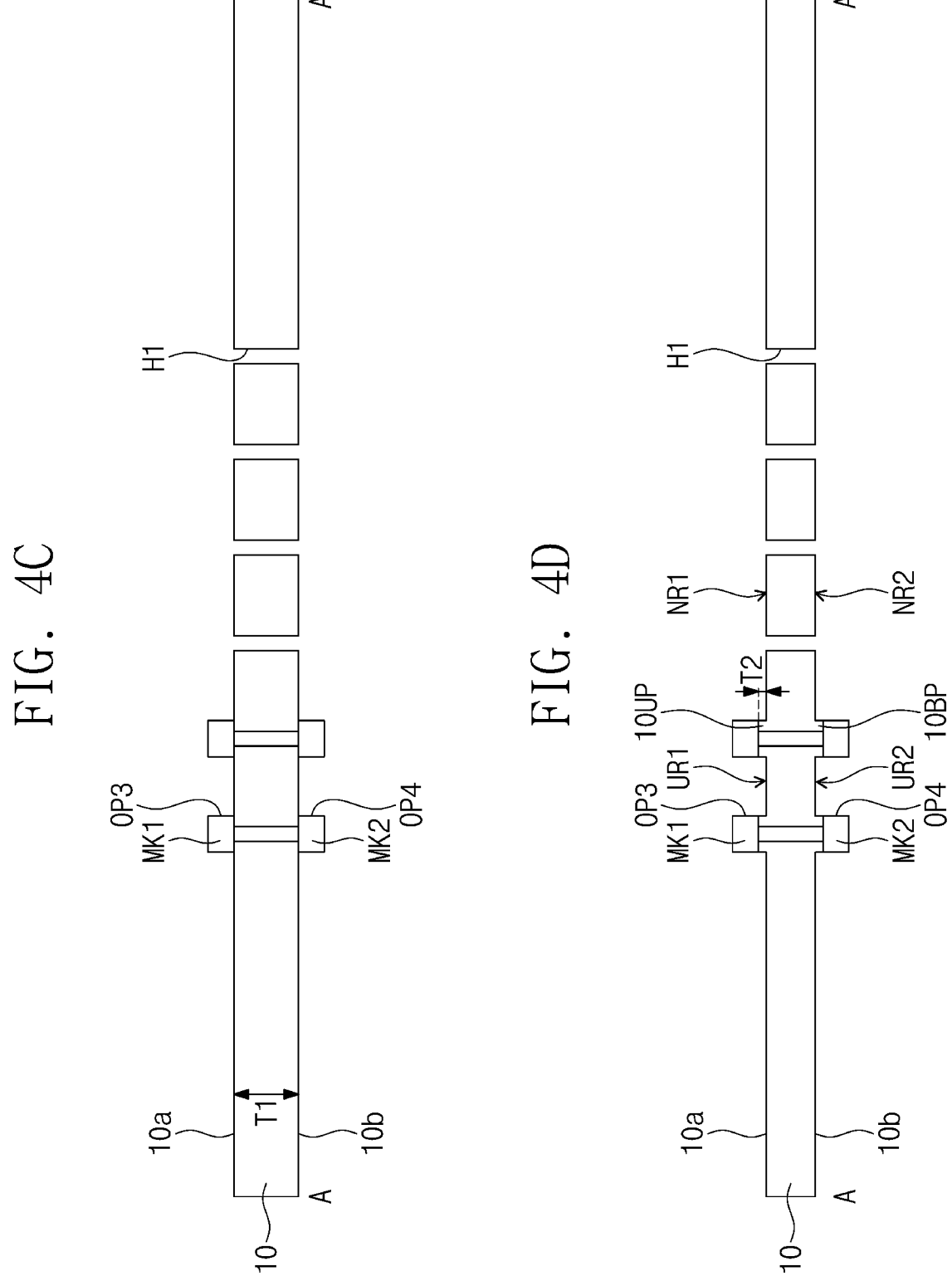

Referring to FIG. 4C, first mask patterns MK1 may be formed on the top surface 10a of the substrate body 10. Second mask patterns MK2 may be formed on the bottom surface 10b of the substrate body 10. The first and second mask patterns MK1 and MK2 may be formed of a photosensitive material. Dry film-shaped photosensitive mask layers may be formed, and then a roll lamination process may be employed to provide heat and pressure to bond a photosensitive mask layer to each of the top and bottom surfaces 10a and 10b of the substrate body 10. Subsequently, exposure and development processes may be performed to form the first mask patterns MK1 and the second mask patterns MK2. The first and second mask patterns MK1 and MK2 may partially overlap the through holes H1 and partially expose the through holes H1. The first mask patterns MK1 having third openings OP3 may define positions of a first trench UR1 and a first recess region NR1 which will be discussed below. The second mask patterns MK2 having fourth openings OP4 may define positions of a second trench UR2 and a second recess region NR2 which will be discussed below.

Referring to FIG. 4D, the first mask patterns MK1 may be used as an etching mask to etch the top surface 10a of the substrate body 10 to form a first trench UR1, a first recess region NR1, and substrate upper protrusions 10UP between the first trench UR1 and the first recess region NR1. The first trench UR1 and the first recess region NR1 may each have a depth from bottom surfaces of the first mask patterns MK1, which depth may be the same as a second thickness T2 of each of the substrate upper protrusions 10UP.

The second mask patterns MK2 may be used as an etching mask to etch the bottom surface 10b of the substrate body 10 to form a second trench UR2, a second recess region NR2, and substrate lower protrusions 10BP between the second trench UR2 and the second recess region NR2. The second trench UR2 and the second recess region NR2 may each have a depth from top surfaces of the second mask patterns MK2, which depth may be the same as the second thickness T2 of each of the substrate lower protrusions 10BP.

Referring to FIG. 4E, the first and second mask patterns MK1 and MK2 may be removed. A third mask pattern MK3 having a fifth opening OP5 may be formed on the top surface 10a of the substrate body 10, and a fourth mask pattern MK4 having a sixth opening OP6 may be formed on the bottom surface 10b of the substrate body 10. Dry film-shaped photosensitive mask layers may be formed, and then a roll lamination process may be employed to provide heat and pressure to bond a photosensitive mask layer to each of the top and bottom surfaces 10a and 10b of the substrate body 10. Subsequently, exposure and development processes may be performed to form the third mask patterns MK3 and the fourth mask patterns MK4.

The third mask pattern MK3 may expose the first trench UR1, while covering the first recess region NR1 and the substrate upper protrusions 10UP. The third mask pattern MK3 may expose a sidewall of the first trench UR1. The fourth mask pattern MK4 may expose the second trench UR2, while covering the second recess region NR2 and the substrate lower protrusions 10BP. The fourth mask pattern MK4 may expose a sidewall of the second trench UR2.

Referring to FIG. 4F, the first trench UR1 may have the bottom and lateral surfaces that are exposed without being covered with the third mask pattern MK3, and one or both of an etching process and a plasma treatment process may be performed on the bottom and lateral surfaces of the first trench UR1. Therefore, the first trench UR1 may have an irregular uneven structure on the bottom and lateral surfaces thereof, and a surface roughness at the bottom surface and lateral surface may be greater than that of the first recess region NR1. The second trench UR2 may have the top and lateral surfaces that are exposed without being covered with the fourth mask pattern MK4, and one or both of an etching process and a plasma treatment process may be performed on the top and lateral surfaces of the second trench UR2. Therefore, the second trench UR2 may have an irregular uneven structure on the top and lateral surfaces thereof, and a surface roughness at the bottom surface and lateral surface may be greater than that of the second recess region NR2.

Figures 4G, 4H:
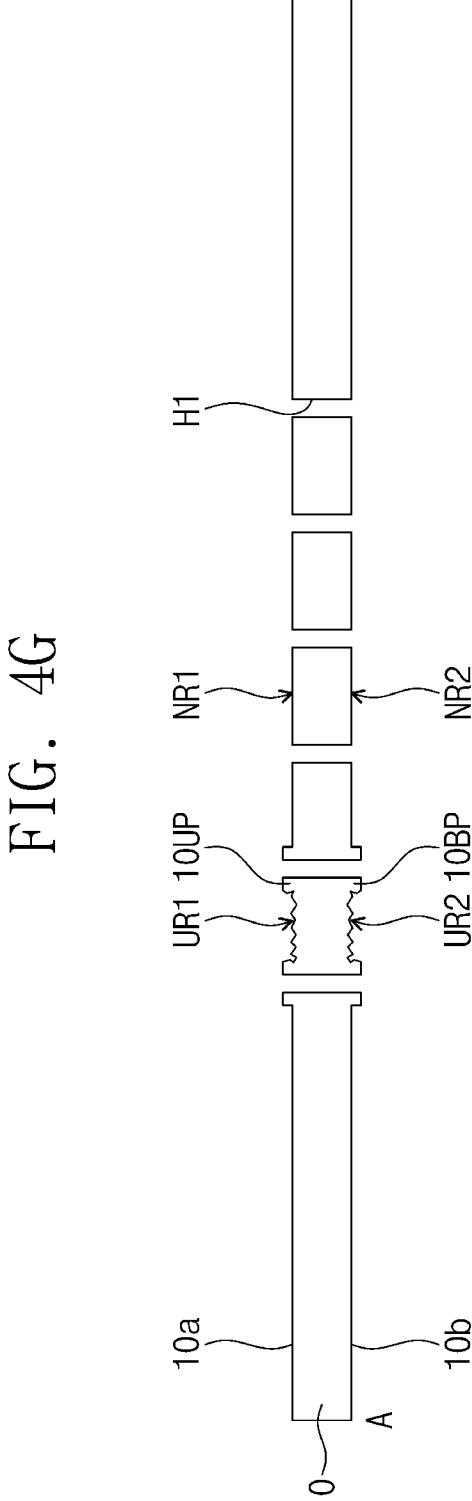

Referring to FIG. 4G, the third mask pattern MK3 may be removed to expose the top surface 10a of the substrate body 10. The fourth mask pattern MK4 may be removed to expose the bottom surface 10b of the substrate body 10.

Referring to FIG. 4H, although not shown, a seed layer may be conformally formed on both of the top and bottom surfaces 10a and 10b of the substrate body 10. A seed layer may also be conformally formed on an inner sidewall of the through hole H1. The seed layer may be formed by a deposition process, such as atomic layer deposition (ALD), chemical vapor deposition (CVD), or physical vapor deposition (PVD). An electroless plating process may be performed to form a conductive layer EP on the seed layer. Thus, the conductive layer EP may be formed on each of the top and bottom surfaces 10a and 10b of the substrate body 10, while filling the through hole H1. The seed layer and the conductive layer EP may be formed of, for example, copper, and an invisible interface may be provided between the seed layer and the conductive layer EP.

Figure 4I:
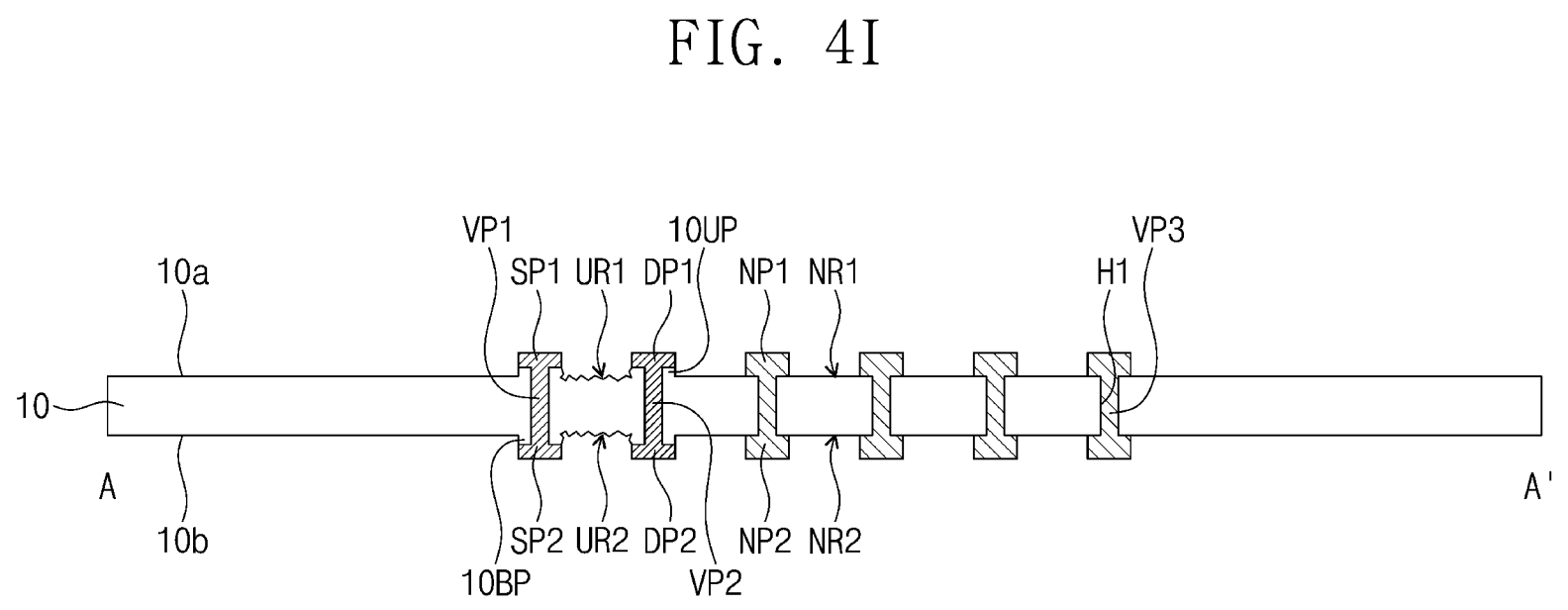

Referring to FIG. 4I, the conductive layer EP may be etched to form first, second, and third upper conductive patterns SP1, DP1, and NP1 and first, second, and third lower conductive patterns SP2, DP2, and NP2. Subsequently, referring to FIGS. 1 to 2B, an upper photosensitive dielectric layer PR1 may be formed to cover the top surface 10a of the substrate body 10, and a lower photosensitive dielectric layer PR2 may be formed to cover the bottom surface 10b of the substrate body 10.

In a method of forming a printed circuit board according to the present inventive concepts, because the first trench UR1 is formed between the first and second upper conductive patterns SP1 and NP1 and has the uneven bottom surface, it may be possible to increase a yield and to prevent an electric short-circuit between the first and second upper conductive patterns SP1 and NP1.

Figure 5:
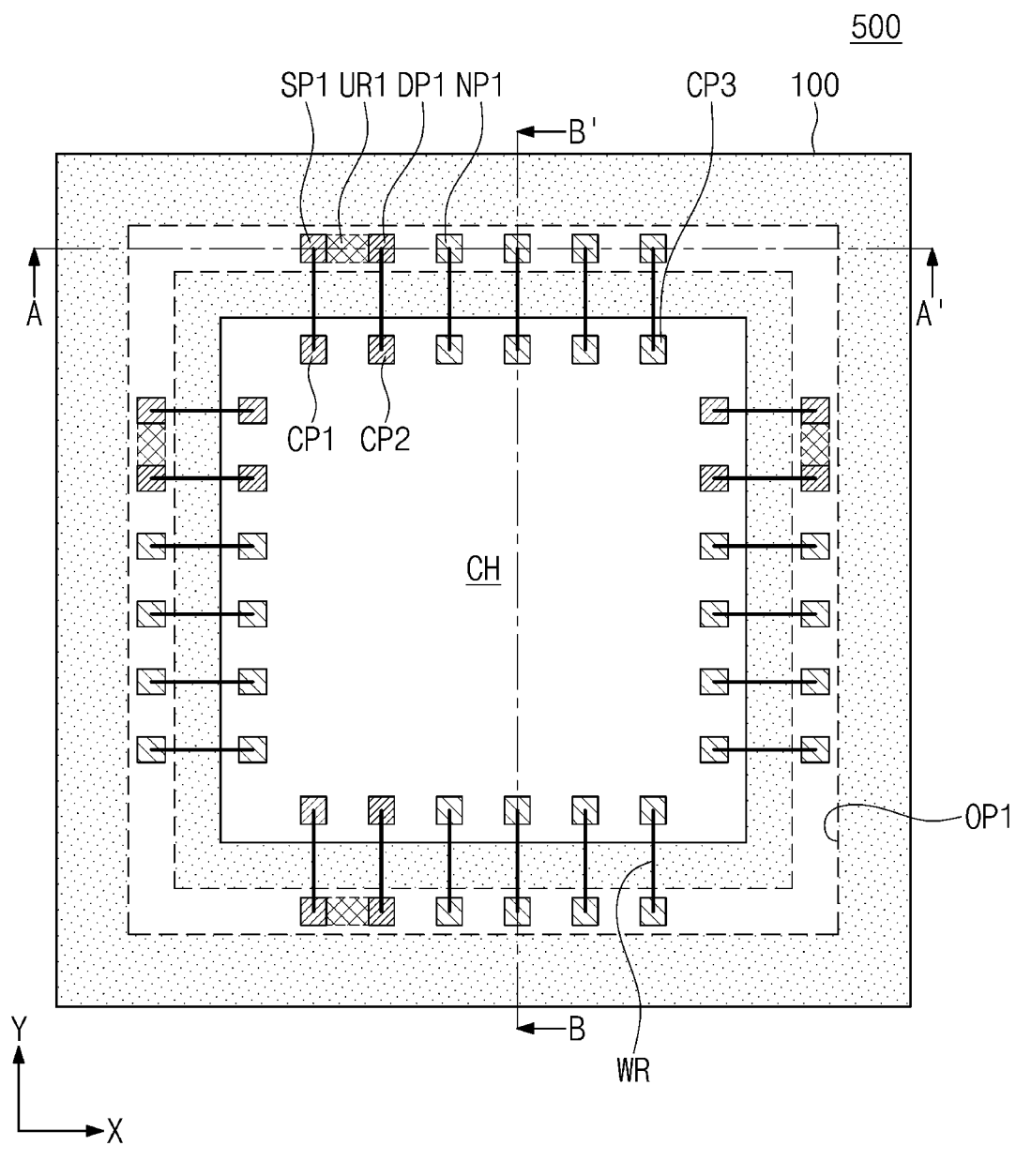
FIG. 5 illustrates a plan view showing a semiconductor package according to some embodiments of the present inventive concepts.
Figure 6A:
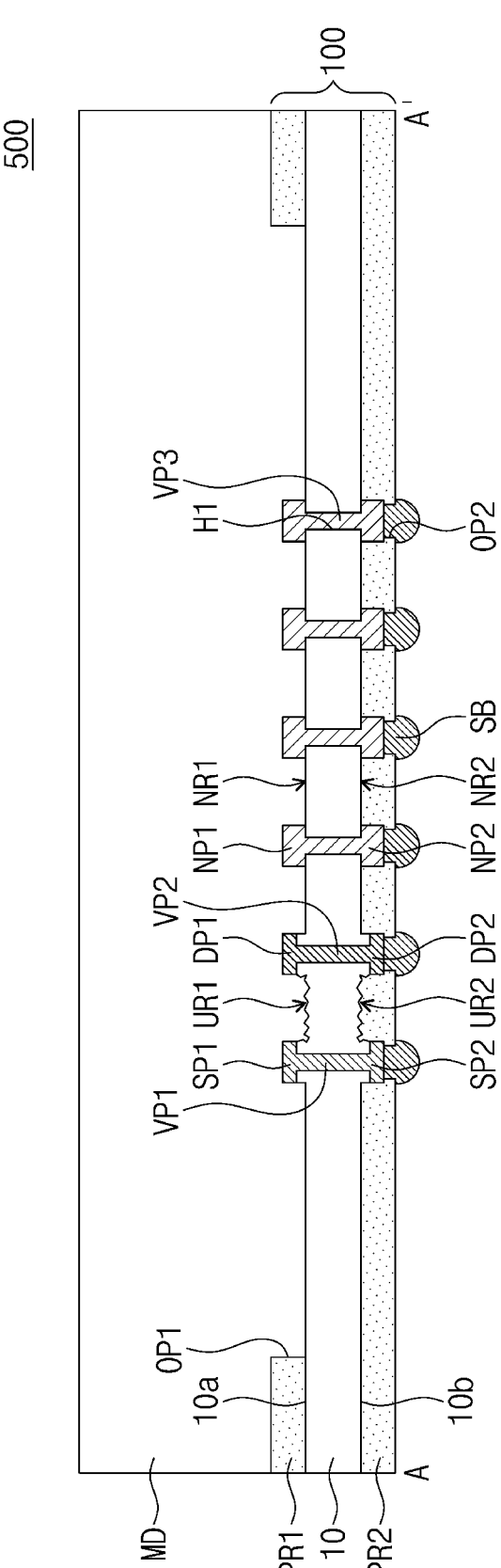
FIG. 6A illustrates a cross-sectional view taken along line A-A' of FIG. 5.
Figure 6B:
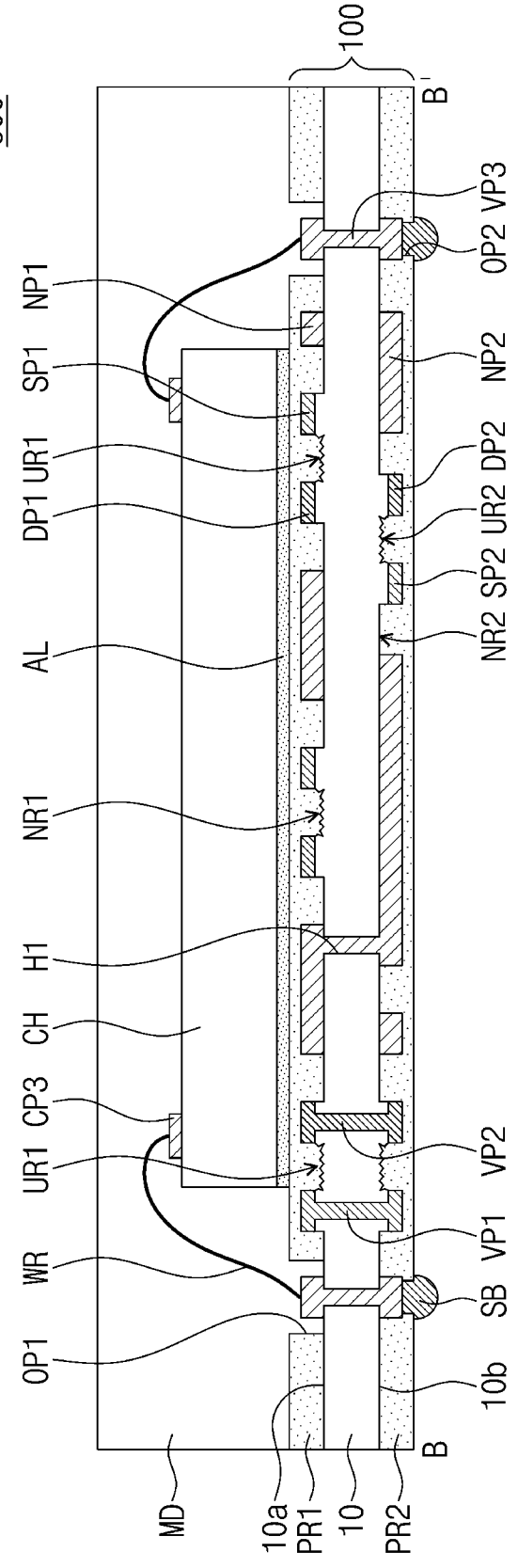
FIG. 6B illustrates a cross-sectional view taken along line B-B' of FIG. 5.

FIG. 5 illustrates a plan view showing a semiconductor package according to some embodiments of the present inventive concepts. FIG. 6A illustrates a cross-sectional view taken along line A-A' of FIG. 5. FIG. 6B illustrates a cross-sectional view taken along line B-B' of FIG. 5.

Referring to FIGS. 5, 6A, and 6B, a semiconductor package 500 according to the present embodiment may include a semiconductor chip CH mounted on a package substrate 100 and a mold layer MD that covers the semiconductor chip CH. The package substrate 100 may be identical or similar to the printed circuit board 100 discussed with reference to FIGS. 1 to 3B. FIG. 6B depicts a single semiconductor chip CH, but the semiconductor chip CH may be provided in plural. For example, a plurality of semiconductor chips CH may be stacked or mounted side by side in one direction. The semiconductor chip CH may be bonded through an adhesion layer AL to the package substrate 100.

The semiconductor chip CH may be one selected from an image sensor chip such as CMOS image sensor (CIS), a microelectromechanical system (MEMS) device chip, an application specific integrated circuit (ASIC) chip, and a memory device chip such as a Flash memory chip, a dynamic random access memory (DRAM) chip, a static random access memory (SRAM) chip, an electrical erasable programmable read only memory (EEPROM) chip, a phase change random access memory (PRAM) chip, a magnetic random access memory (MRAM) chip, a resistive random access memory (ReRAM) chip, a high bandwidth memory (HBM) chip, and a hybrid memory cubic (HMC) chip.

The semiconductor chip CH may be provided with first to third chip pads CP1 to CP3 on a top surface thereof. The semiconductor chip CH may be connected through wires WR to the package substrate 100. The first chip pad CP1 of the semiconductor chip CH may be connected to the first upper conductive pattern SP1 and may be provided with, for example, a ground voltage Vss. The second chip pad CP2 of the semiconductor chip CH may be connected to the second upper conductive pattern DP1 of the package substrate 100 and may be provided with, for example, a power voltage Vdd. The third chip pad CP3 of the semiconductor chip CH may be connected to the third upper conductive pattern NP1 of the package substrate 100 and may be provided with, for example, a command/access/data signal voltage.

The mold layer MD may include a dielectric resin, for example, an epoxy molding compound (EMC). The mold layer MD may further include fillers, and the fillers may be dispersed in the dielectric resin.

External connection terminals SB may be bonded to the first, second, and third lower conductive patterns SP2, DP2, and NP2 of the package substrate 100. The external connection terminals SB may include at least one selected from solder balls, conductive bumps, and conductive pillars. The external connection terminals SB may include at least one selected from tin, lead, silver, copper, aluminum, gold, and nickel.

The semiconductor package 500 according to the present inventive concepts may include the package substrate 100 in which the first trench UR1 is formed between the first and second upper conductive patterns SP1 and NP1. The semiconductor package 500 according to the present inventive concepts may include the package substrate 100 in which the second trench UR2 is formed between the first and second lower conductive patterns SP2 and NP2.

Figure 7:
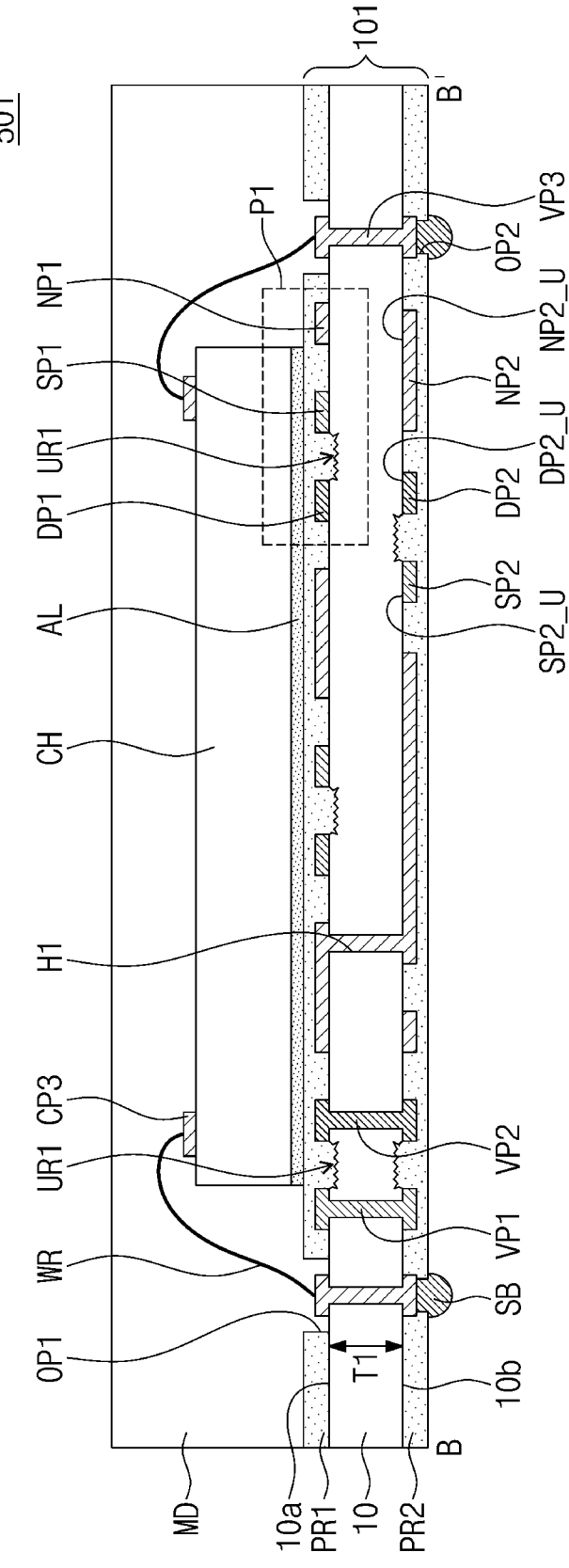
FIG. 7 illustrates a cross-sectional view taken along line B-B' of FIG. 5.
Figure 8:
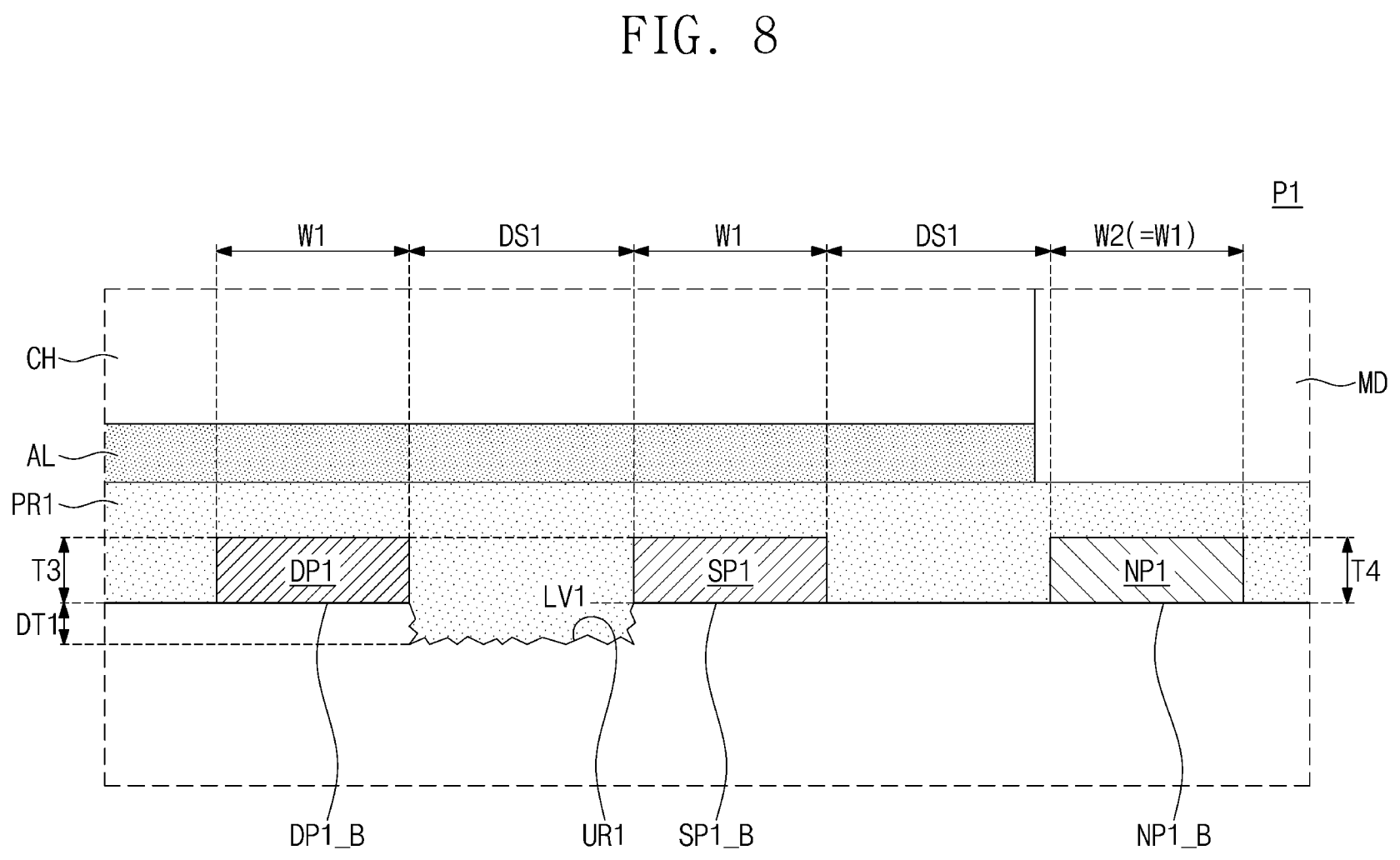

FIG. 7 illustrates a cross-sectional view taken along line B-B' of FIG. 5. FIG. 8 illustrates an enlarged view showing section P1 of FIG. 7.

Referring to FIGS. 7 and 8, a semiconductor package 501 according to the present embodiment may include a package substrate 101 that does not include any of the first and second recess regions NR1 and NR2 of FIG. 2B. For example, the package substrate 101 may include only the first and second trenches UR1 and UR2 of FIG. 2B. The first trench UR1 may have an irregular uneven structure at its bottom surface, and the second trench UR2 may have an irregular uneven structure at its top surface.

The bottom surface of the first trench UR1 may have a first depth DT1 from the top surface 10a of the substrate body 10. The first depth DT1 may be about 1/20 to about 1/5 of the first maximum thickness T1 of the substrate body 10. The first trench UR1 may have a first surface roughness at the bottom surface thereof. The substrate body 10 may have a second surface roughness at the top surface 10a thereof. The first surface roughness may be greater than the second surface roughness. For example, the first surface roughness may be about 2 times to about 3 times the second surface roughness.

The first trench UR1 may also have the first surface roughness at the lateral surface thereof. Such structure having the first trench UR1 and a high surface roughness therein may allow neighboring first and second upper conductive patterns SP1 and DP1 having a large difference in voltage to have an effective interval substantially greater than the first interval DS1, which effective interval may correspond to a length of the top surface 10a of the substrate body 10 between a lower corner of the first upper conductive pattern SP1 and a lower corner of the second upper conductive pattern DP1.

A bottom surface SP1_B of the first upper conductive pattern SP1 and a bottom surface DP1_B of the second upper conductive pattern DP1 may be located at a first vertical level LV1, and a bottom surface NP1_B of the third upper conductive pattern NP1 may be located at a second vertical level LV2 substantially the same as the first vertical level LV1.

Each of the first and second upper conductive patterns SP1 and DP1 may have a first width W1. The third upper conductive patterns NP1 may each have a second width W2 substantially the same as the first width W1. Each of the first and second upper conductive patterns SP1 and DP1 may have a third thickness T3. Each of the third upper conductive patterns NP1 may have a fourth thickness T4 substantially the same as the third thickness T3. The first width W1 may range, for example, from about 10 μm to about 100 μm.

A top surface SP2_U of the first lower conductive pattern SP2 and a top surface DP2_U of the second lower conductive pattern DP2 may be located at substantially the same vertical level as that of a top surface NP2_U of the third lower conductive pattern NP2. The first, second, and third lower conductive patterns SP2, DP2, and NP2 may have the same width and thickness. Other configurations may be identical or similar to those discussed with reference to FIGS. 5 to 6B.

Figure 9:
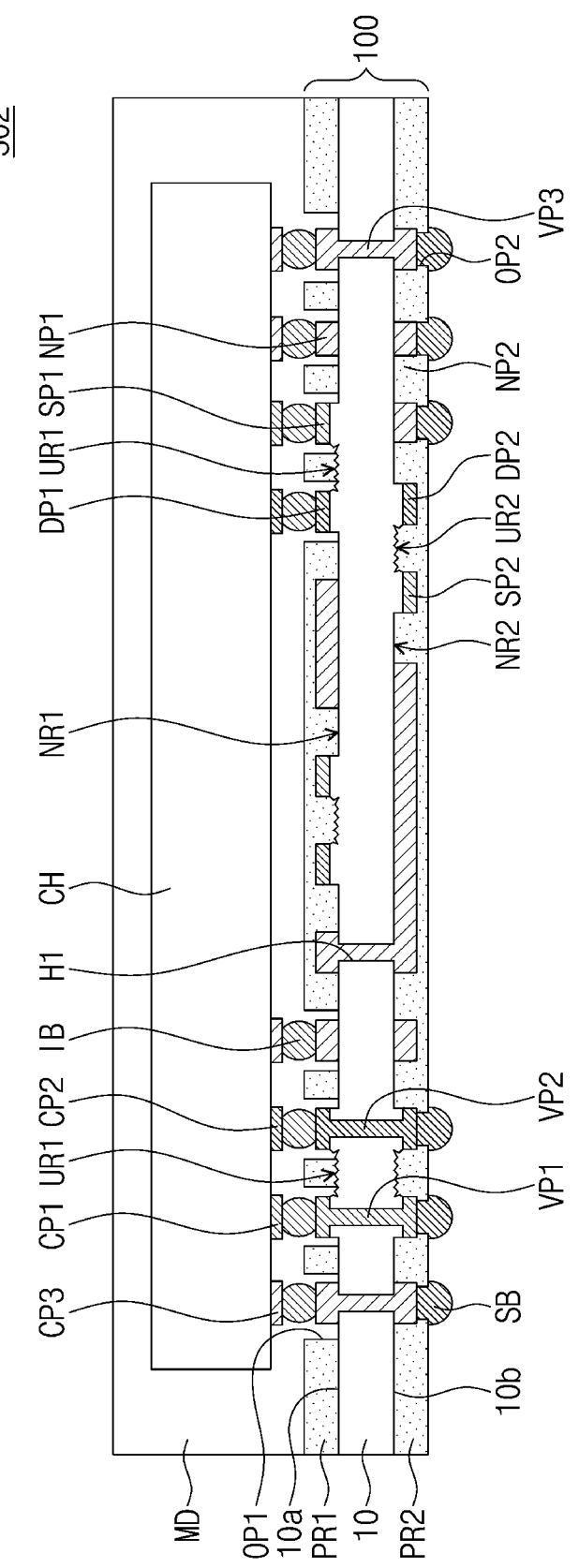
FIG. 9 illustrates a cross-sectional view showing a semiconductor package according to some embodiments of the present inventive concepts.

FIG. 9 illustrates a cross-sectional view showing a semiconductor package according to some embodiments of the present inventive concepts.

Referring to FIG. 9, in a semiconductor package 502 according to the present embodiment, the semiconductor chip CH may be flip-chip bonded through inner connection members IB to the package substrate 100. The inner connection members IB may include at least one selected from solder balls, conductive bumps, and conductive pillars. The inner connection members IB may include at least one selected from tin, lead, silver, copper, aluminum, gold, and nickel. Other configurations may be identical or similar to those discussed with reference to FIGS. 5 to 6B.

Figure 10:
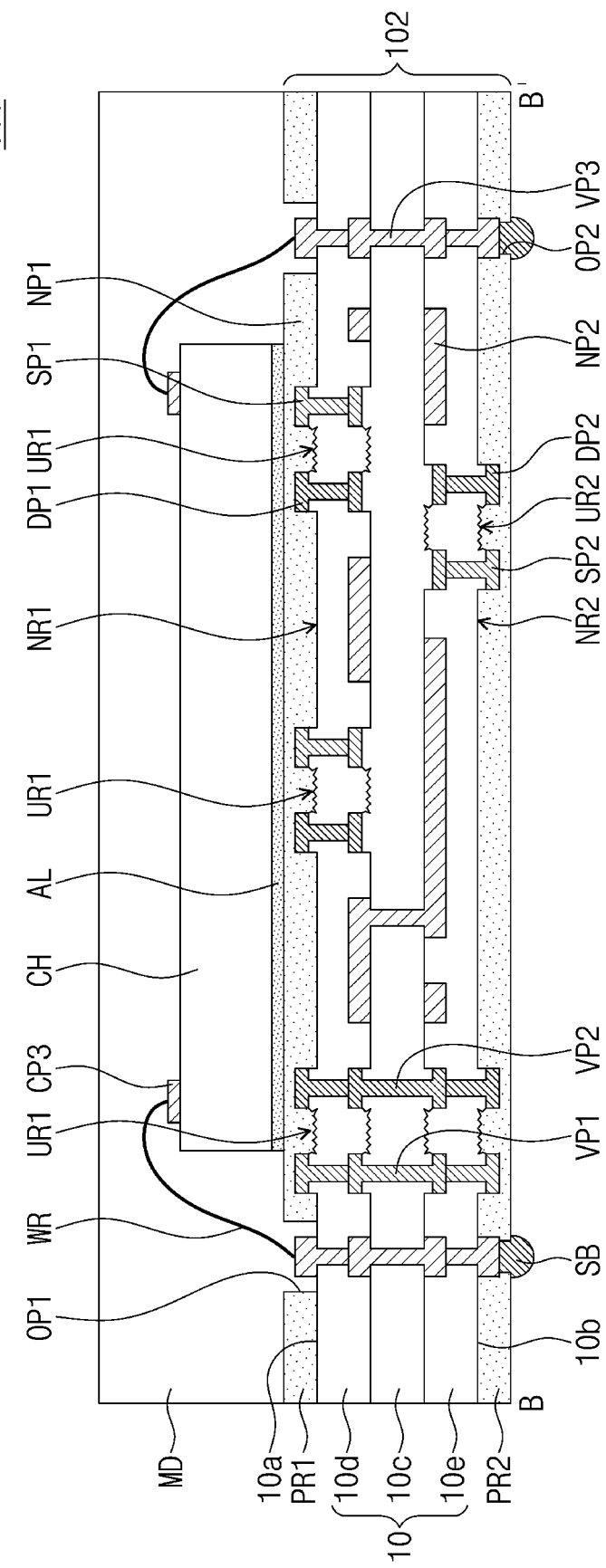
FIG. 10 illustrates a cross-sectional view taken along line B-B' of FIG. 5.

FIG. 10 illustrates a cross-sectional view taken along line B-B' of FIG. 5.

Referring to FIG. 10, a semiconductor package 503 according to the present embodiment may include a package substrate 102 that is a multi-layered printed circuit board. The package substrate 102 may be configured such that the substrate body 10 includes a plurality of stacked substrate dielectric layers 10c, 10d, and 10e. For example, the substrate body 10 may include a first substrate dielectric layer 10c, a second substrate dielectric layer 10d disposed on a top surface of the first substrate dielectric layer 10c, and a third substrate dielectric layer 10e disposed on a bottom surface of the first substrate dielectric layer 10c. The first to third substrate dielectric layers 10c to 10e may be formed of a thermosetting resin such as epoxy resin, a thermoplastic resin such as polyimide, a resin in which a thermosetting or thermoplastic resin is impregnated with a reinforcement such as glass fiber and/or inorganic filler, which impregnated resin includes prepreg and/or photosensitive resin, but the present inventive concepts are not limited thereto. A photo-solder resist (PSR) may be used to form the upper photosensitive dielectric layer PR1 and the lower photosensitive dielectric layer PR2. The first substrate dielectric layer 10c may be called a core layer.

The first to third substrate dielectric layers 10c to 10e may have the first trenches UR1, the first recess regions NR1, the second trenches UR2, and the second recess regions NR2 formed therein. The first, second, and third upper conductive patterns SP1, DP1, and NP1 may also be formed between the first and second substrate dielectric layers 10c and 10d. The first, second, and third lower conductive patterns SP2, DP2, and NP2 may also be formed between the first and third substrate dielectric layers 10c and 10e. The first to third vias VP1 to VP3 may penetrate each of the first to third substrate dielectric layers 10c to 10e. Other configurations may be identical or similar to those discussed with reference to FIGS. 5 to 6B.

Figure 11:
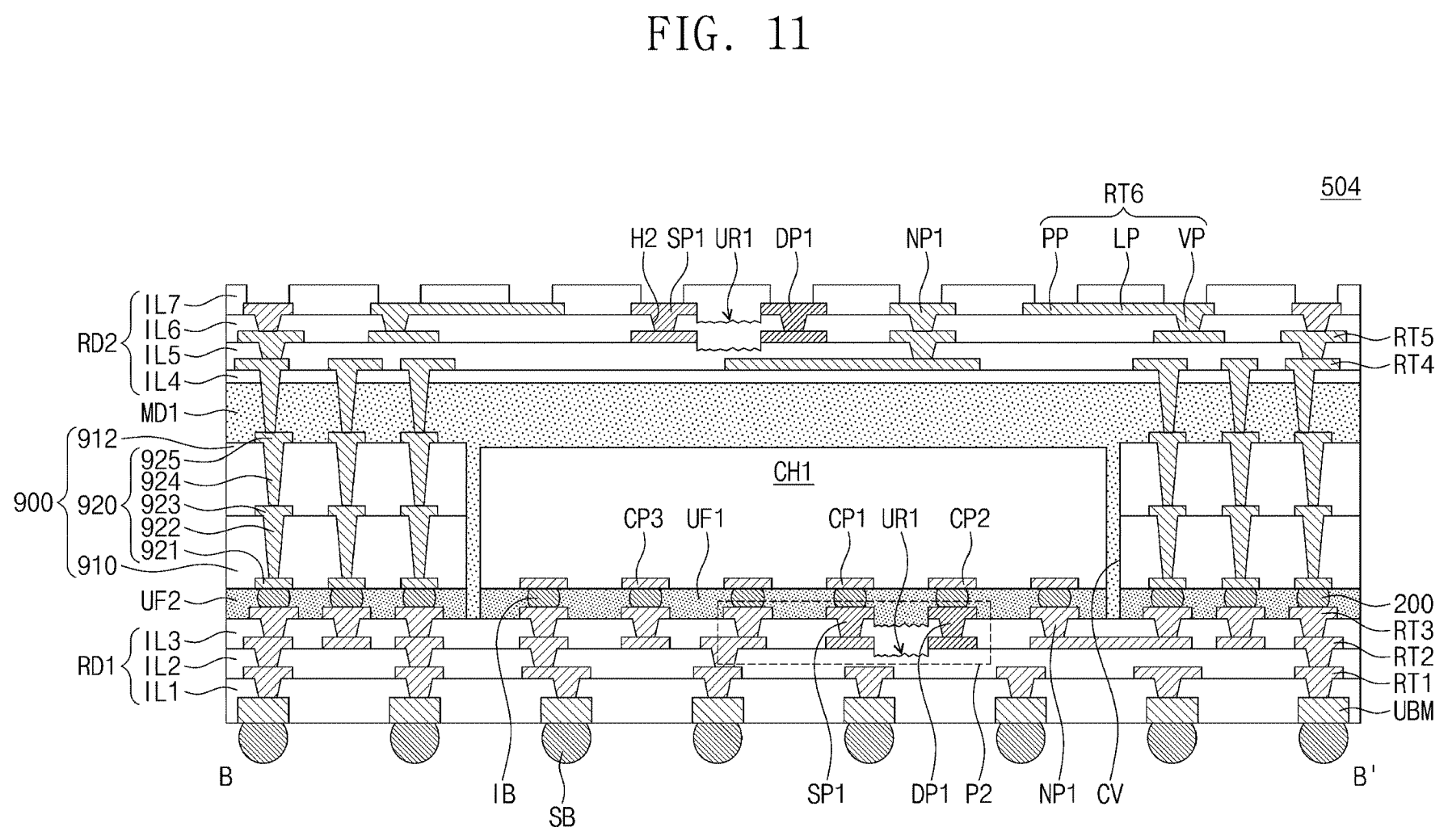
Figure 12:
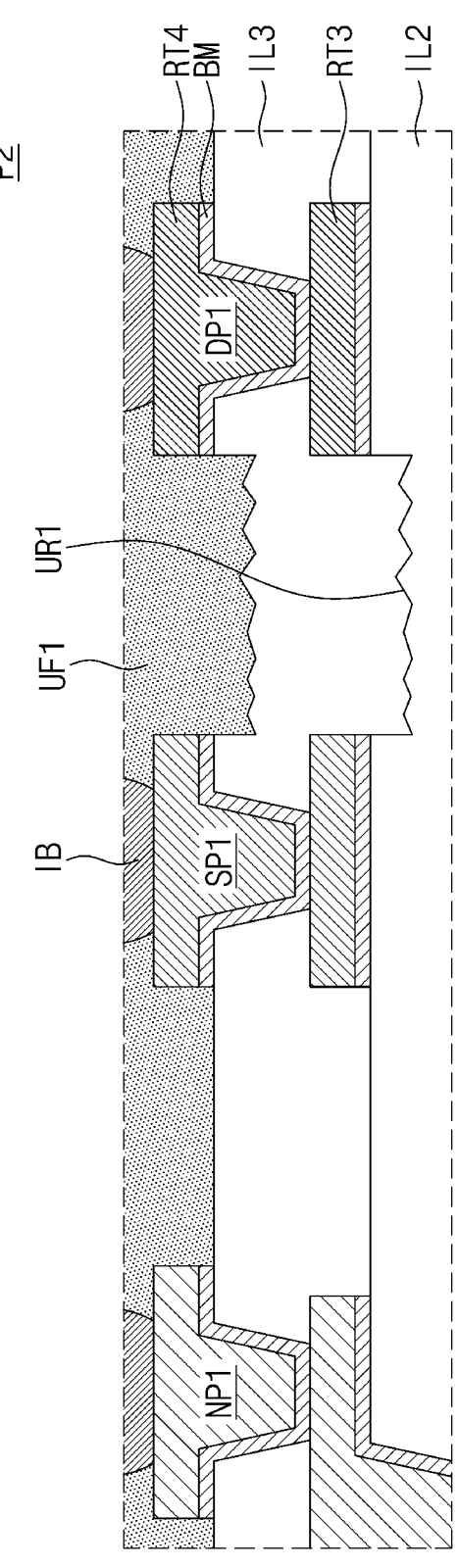
FIG. 12 illustrates an enlarged view showing section P2 of FIG. 11.

FIG. 11 illustrates a cross-sectional view showing a semiconductor package according to some embodiments of the present inventive concepts. FIG. 12 illustrates an enlarged view showing section P2 of FIG. 11.

Referring to FIGS. 11 and 12, a semiconductor package 504 according to the present embodiment may be shaped like a chip-last type fan-out panel level package (FOPLP). The semiconductor package 504 may include a first redistribution substrate RD1 and a semiconductor chip CH1 mounted on the first redistribution substrate RD1. The first redistribution substrate RD1 may be provided thereon with a connection substrate 900 that has a cavity CV on a center thereof. The semiconductor chip CH1 may be inserted into the cavity CV. The semiconductor chip CH1 and the connection substrate 900 may be covered with a mold layer MD1. A portion of the mold layer MD1 may be inserted into the cavity CV to intervene between the semiconductor chip CH1 and the connection substrate 900. A second redistribution substrate RD2 may be disposed on the mold layer MD1. In this description, the term "redistribution substrate" may be called a package substrate, a redistribution layer, or a wiring structure.

The first redistribution substrate RD1 may include first, second, and third redistribution dielectric layers IL10, IL2, and IL3 that are sequentially stacked. The first, second, and third redistribution dielectric layers IL1, IL2, and IL3 may each include a photo-imageable dielectric (PID) layer. The first redistribution dielectric layer IL1 may be provided with lower bonding pads UBM therein.

A first redistribution pattern RT1 may be disposed between the first redistribution dielectric layer IL1 and the second redistribution dielectric layer IL2. A second redistribution pattern RT2 may be disposed between the second redistribution dielectric layer IL2 and the third redistribution dielectric layer IL3. A third redistribution pattern RT3 may be disposed on the third redistribution dielectric layer IL3.

External connection terminals SB may be bonded to the lower bonding pads UBM. One or more of the first to third redistribution patterns RT1 to RT3 may include a via part VP that penetrates a corresponding one of the first, second, and third redistribution dielectric layers IL1, IL2, and IL3, a pad part PP, and a line part LP that connects the via part VP and the pad part PP to each other (like a sixth redistribution pattern RT6). The via part VP may have an inclined lateral surface. The via part VP may have a width that decreases in a downward direction. The lower bonding pads UBM and the first to third redistribution patterns RT1 to RT3 may include metal, such as copper, aluminum, gold, nickel, or titanium. A diffusion stop layer BM may be interposed between the first to third redistribution patterns RT1 to RT3 and the first to third redistribution dielectric layers IL1 to IL3 (as shown in FIG. 12). Alternatively, the first to third redistribution patterns RT1 to RT3 may each include the diffusion stop layer BM. The diffusion stop layer BM may include, for example, titanium, tantalum, titanium nitride, tantalum nitride, or tungsten nitride.

The semiconductor chip CH1 may include chip pads CP1 to CP3. The semiconductor chip CH1 may be bonded through inner connection members IB to the third redistribution patterns RT3 of the first redistribution substrate RD1.

The connection substrate 900 may include a plurality of base layers 910 and 912 and a conductive structure 920. The base layers 910 and 912 may include, for example, a first base layer 910 and a second base layer 912 that constitute a two-story structure. The base layers 910 and 912 may include three or more stacked base layers. The base layers 910 and 912 may include a dielectric material. For example, the base layers 910 and 912 may include a carbon-based material, a ceramic, or a polymer.

The conductive structure 920 may include a connection pad 921, a first connection via 922, a first connection line 923, a second connection via 924, and a second connection line 925. In the present embodiment, the first connection via 922 and the first connection line 923 may constitute a single unitary piece. The second connection via 924 and the second connection line 925 may constitute a single unitary piece. The conductive structure 920 may include metal, such as copper, aluminum, gold, nickel, or titanium.

The second redistribution substrate RD2 may include fourth, fifth, sixth, and seventh redistribution dielectric layers IL4, IL5, IL6, and IL7 that are sequentially stacked.

The fourth, fifth, sixth, and seventh redistribution dielectric layers IL4, IL5, IL6, and IL7 may each include a photo-imageable dielectric (PID) layer. A fourth redistribution pattern RT4 may be disposed between the fourth redistribution dielectric layer IL4 and the fifth redistribution dielectric layer IL5. A fifth redistribution pattern RT5 may be interposed between the fifth redistribution dielectric layer IL5 and the sixth redistribution dielectric layer IL6. A sixth redistribution pattern RT6 may be interposed between the sixth redistribution dielectric layer IL6 and the seventh redistribution dielectric layer IL7.

The fourth to sixth redistribution patterns RT4 to RT6 may include metal, such as copper, aluminum, gold, nickel, or titanium.

Like the first to third redistribution patterns RT1 to RT3, one or more of the fourth to sixth redistribution patterns RT4 to RT6 may include a via part VP, a pad part PP, and a line part LP. The seventh redistribution dielectric layer IL7 may include a plurality of upper pad holes H2 that expose the pad parts PP of the sixth redistribution patterns RT6. A diffusion stop layer BM may be interposed between the fourth to sixth redistribution patterns RT4 to RT6 and the fourth to sixth redistribution dielectric layers IL4 to IL6.

The via part VP of the fourth redistribution pattern RT4 may penetrate the fourth redistribution dielectric layer IL4 and the mold layer MD1, thereby being connected to the second connection line 925. The number of the upper pad holes H2 may be different from that of the lower bonding pads UBM.

The connection pad 921 of the connection substrate 900 may be bonded through the inner connection member IB to the third redistribution pattern RT3 of the first redistribution substrate RD1.

The semiconductor chip CH1 may be spaced apart from the first redistribution substrate RD1, and a first under-fill layer UF1 may be interposed between the semiconductor chip CH1 and the first redistribution substrate RD1. The connection substrate 900 may be spaced apart from the first redistribution substrate RD1, and a second under-fill layer UF2 may be interposed between the connection substrate 900 and the first redistribution substrate RD1. The first and second under-fill layers UF1 and UF2 may include an epoxy resin. The first and second under-fill layers UF1 and UF2 may further include inorganic or organic fillers.

One or more of the first to sixth redistribution patterns RT1 to RT6 may include first, second, and third upper conductive patterns SP1, DP1, and NP1 that are adjacent to each other. The first upper conductive patterns SP1 may be provided with, for example, a ground voltage Vss. The second upper conductive patterns DP1 may be provided with, for example, a power voltage Vdd. The third upper conductive patterns NP1 may be provided with a command/access/data signal voltage. One or more of the first to sixth redistribution dielectric layers IL1 to IL6 may include a first trench UR1 formed between the first and second upper conductive patterns SP1 and DP1. The first trench UR1 may have a depth that is about 1/20 to about 1/5 of a thickness of one of the first to sixth redistribution dielectric layers IL1 to IL6. The first under-fill layer UF1 may at least partially fill the first trench UR1 formed in the third redistribution dielectric layer IL3.

The first trench UR1 may have an irregular uneven structure on a bottom surface thereof. The first trench UR1 may have a first surface roughness at the bottom surface thereof. Each of the first to sixth redistribution dielectric layers IL1 to IL6 may have a second surface roughness at a top surface thereof. The first surface roughness may be greater than the second surface roughness. For example, the first surface roughness may be about 2 times to about 3 times the second surface roughness.

The first trench UR1 may also have the first surface roughness at a lateral surface thereof. Such structure having the first trench UR1 and a high surface roughness therein may cause an increase in effective interval between the first and second upper conductive patterns SP1 and DP1 having a large difference in voltage, and thus an electric short-circuit may be prevented between the first and second upper conductive patterns SP1 and DP1. Other configurations may be identical or similar to those discussed above with reference to FIG. 9.

In a printed circuit board according to some embodiments of the present inventive concepts, because a trench is formed between first and second upper conductive patterns having a large difference in voltage, the first and second upper conductive patterns may have an increased effective interval to prevent an electric short-circuit therebetween. In addition, because the trench has on its bottom surface an uneven structure to cause a further increase in effective interval between the first and second upper conductive patterns, an electric short-circuit may be more effectively prevented between the first and second upper conductive patterns. Accordingly, there may be an increase in reliability of the printed circuit board and a semiconductor package including the same.

In a method of fabricating a printed circuit board according to some embodiments of the present inventive concepts, a trench may be formed to lie between first and second upper conductive patterns having a large difference in voltage and to have a rugged bottom surface, and thus it may be possible to prevent an electric short-circuit between the first and second upper conductive patterns, to reduce process failure, and to increase a yield.

Although the present inventive concepts have been described in connection with some embodiments of the present inventive concepts illustrated in the accompanying drawings, it will be understood to those skilled in the art that various substitutions, modifications, and changes may be thereto without departing from the scope of the present inventive concepts. For example, features of embodiments of FIGS. 1 to 12 may be combined with each other.

What is claimed is:

1. A printed circuit board, comprising:
a substrate body;
first, second, and third upper conductive patterns that are side by side in a first direction on a top surface of the substrate body; and
a photosensitive dielectric layer that at least partially covers the top surface of the substrate body,
wherein a first trench is in the substrate body between the first and second upper conductive patterns,
wherein the first trench has a first surface roughness at a bottom surface thereof,
wherein the substrate body has a second surface roughness at the top surface thereof between the second and third upper conductive patterns,
wherein the first surface roughness is greater than the second surface roughness,
wherein each of the first and second upper conductive patterns has a first thickness,
wherein the third upper conductive pattern has a second thickness greater than the first thickness, and
wherein the first trench has an irregular uneven surface at the bottom surface of the first trench.

2. The printed circuit board of claim 1, wherein a difference in voltage between the first and second upper conductive patterns is greater than a difference in voltage between the second and third upper conductive patterns.

3. The printed circuit board of claim 1, wherein
each of the first and second upper conductive patterns has a first width, and
the third upper conductive pattern has a second width less than the first width.

4. The printed circuit board of claim 1, wherein
bottom surfaces of the first and second upper conductive patterns are at a higher vertical level than a bottom surface of the third upper conductive pattern, and
the bottom surface of the first trench is at a vertical level the same as or lower than a vertical level of the bottom surface of the third upper conductive pattern.

5. The printed circuit board of claim 1, further comprising:
first, second, and third lower conductive patterns that are on a bottom surface of the substrate body and are side by side in the first direction;
a first via pattern that penetrates the substrate body and connects the first upper conductive pattern to the second lower conductive pattern; and
a second via pattern that penetrates the substrate body and connects the third upper conductive pattern to the third lower conductive pattern,
wherein the first via pattern has a first vertical length, and
wherein the second via pattern has a second vertical length less than the first vertical length.

6. The printed circuit board of claim 1, further comprising first, second, and third lower conductive patterns that are on a bottom surface of the substrate body and are side by side in the first direction,
wherein the substrate body has a third surface roughness at the bottom surface of the substrate body between the first and second lower conductive patterns,
wherein the substrate body has a fourth surface roughness at the bottom surface of the substrate body between the second and third lower conductive patterns,
wherein the third surface roughness is greater than the fourth surface roughness,
wherein each of the first and second lower conductive patterns has a third width, and
wherein the third lower conductive pattern has a fourth width less than the third width.

7. The printed circuit board of claim 6, wherein a difference in voltage between the first and second lower conductive patterns is greater than a difference in voltage between the second and third lower conductive patterns.

8. The printed circuit board of claim 6, wherein
each of the first and second lower conductive patterns has a third thickness, and
the third lower conductive pattern has a fourth thickness greater than the third thickness.

9. The printed circuit board of claim 6, wherein
the substrate body has a recessed area that is upwardly recessed between the first and second lower conductive patterns,
top surfaces of the first and second lower conductive patterns are at a lower vertical level than a top surface of the third lower conductive pattern, and
a top surface of the recessed area is at a vertical level the same as or higher than a vertical level of the top surface of the third lower conductive pattern.

10. The printed circuit board of claim 1, wherein
the substrate body has a first maximum thickness, the substrate body includes a substrate protrusion by the first trench, the first and second upper conductive patterns are on the substrate protrusion, the substrate protrusion has a second thickness from the bottom surface of the first trench, and the second thickness is about $\frac{1}{20}$ to about $\frac{1}{5}$ the first maximum thickness.

11. The printed circuit board of claim 1, further comprising:

a substrate dielectric layer between the substrate body and the photosensitive dielectric layer; and fourth, fifth, and sixth upper conductive patterns on the substrate dielectric layer and covered with the photosensitive dielectric layer, wherein the fourth, fifth, and sixth upper conductive patterns are side by side in the first direction, wherein a second trench is in a top surface of the substrate dielectric layer between the fourth and fifth upper conductive patterns, wherein the second trench has a third surface roughness at a bottom surface of the second trench, wherein the substrate dielectric layer has a fourth surface roughness at the top surface of the substrate dielectric layer between the fifth and sixth upper conductive patterns, wherein the third surface roughness is greater than the fourth surface roughness, wherein each of the fourth and fifth upper conductive patterns has a third width, and wherein the sixth upper conductive pattern has a fourth width less than the third width.

12. A printed circuit board, comprising:

a substrate body;

first, second, and third upper conductive patterns that are side by side in a first direction on a top surface of the substrate body and are spaced apart from each other; and a photosensitive dielectric layer that at least partially covers the top surface of the substrate body, wherein a first trench is in the substrate body between the first and second upper conductive patterns, wherein the first trench has a first surface roughness at a bottom surface of the first trench, wherein the substrate body has a second surface roughness at the top surface of the substrate body between the second and third upper conductive patterns, wherein the first surface roughness is greater than the second surface roughness, wherein the substrate body has a first maximum thickness, wherein the substrate body includes a substrate protrusion by the first trench, wherein the first and second upper conductive patterns are on the substrate protrusion, wherein the substrate protrusion has a second thickness from the bottom surface of the first trench, wherein each of the first and second upper conductive patterns has a third thickness and a first width, wherein the third upper conductive pattern has a fourth thickness greater than the third thickness, wherein the third upper conductive pattern has a second width less than the first width, and wherein the second thickness is about $\frac{1}{20}$ to about $\frac{1}{5}$ the first maximum thickness.

13. The printed circuit board of claim 12, wherein a difference in voltage between the first and second upper conductive patterns is greater than a difference in voltage between the second and third upper conductive patterns.

14. The printed circuit board of claim 12, wherein bottom surfaces of the first and second upper conductive patterns are at a higher vertical level than a bottom surface of the third upper conductive pattern, and the bottom surface of the first trench is at a vertical level the same as or lower than a vertical level of the bottom surface of the third upper conductive pattern.

15. The printed circuit board of claim 12, further comprising:

first, second, and third lower conductive patterns that are on a bottom surface of the substrate body and are side by side in the first direction;

a first via pattern that penetrates the substrate body and connects the first upper conductive pattern to the first lower conductive pattern; and a second via pattern that penetrates the substrate body and connects the third upper conductive pattern to the third lower conductive pattern, wherein the first via pattern has a first vertical length, and wherein the second via pattern has a second vertical length less than the first vertical length.

16. A semiconductor package, comprising:

a substrate;

at least one semiconductor chip mounted on and connected to the substrate; and a mold layer that covers the semiconductor chip and a portion of the substrate, wherein the substrate includes:

a first dielectric layer;

first, second, and third upper conductive patterns that are side by side in a first direction on a top surface of the first dielectric layer; and a second dielectric layer that at least partially covers the top surface of the first dielectric layer, wherein a first trench is in the first dielectric layer between the first and second upper conductive patterns, wherein the first trench has an irregular uneven bottom surface, wherein each of the first and second upper conductive patterns has a first width, and wherein the third upper conductive pattern has a second width less than the first width.

17. The semiconductor package of claim 16, wherein a difference in voltage between the first and second upper conductive patterns is greater than a difference in voltage between the second and third upper conductive patterns.

18. The semiconductor package of claim 16, wherein bottom surfaces of the first and second upper conductive patterns are at a higher vertical level than a bottom surface of the third upper conductive pattern, and the bottom surface of the first trench is at a vertical level the same as or lower than a vertical level of the bottom surface of the third upper conductive pattern.

19. The semiconductor package of claim 16, further comprising:

first, second, and third lower conductive patterns that are on a bottom surface of the first dielectric layer and are side by side in the first direction;

a first via pattern that penetrates the first dielectric layer and connects the first upper conductive pattern to the first lower conductive pattern; and a second via pattern that penetrates the first dielectric layer and connects the third upper conductive pattern to the third lower conductive pattern, wherein the first via pattern has a first vertical length, and wherein the second via pattern has a second vertical length less than the first vertical length.

\* \* \* \* \*